United States Patent [19]
Sakusabe

[11] Patent Number: 6,121,840
[45] Date of Patent: Sep. 19, 2000

[54] HIGH-FREQUENCY AMPLIFIER

[75] Inventor: Kenichi Sakusabe, Tokyo-to, Japan

[73] Assignee: Murata Manufacturing Co., Ltd., Japan

[21] Appl. No.: 08/997,013

[22] Filed: Dec. 23, 1997

[51] Int. Cl.[7] .............................. H03F 3/16; H03F 3/191
[52] U.S. Cl. ............................................. 330/277; 330/306
[58] Field of Search .................................. 330/277, 302, 330/306, 286, 311

[56] References Cited

U.S. PATENT DOCUMENTS

| | | | |
|---|---|---|---|
| 5,010,305 | 4/1991 | Shiga | 330/277 |
| 5,051,706 | 9/1991 | Zushi | 330/277 |
| 5,146,178 | 9/1992 | Nojima et al. | 330/277 |
| 5,208,554 | 5/1993 | Endler et al. | 330/295 |
| 5,233,313 | 8/1993 | Kohno et al. | 330/277 |
| 5,329,249 | 7/1994 | Cripps | 330/302 |
| 5,406,226 | 4/1995 | Cioffi et al. | 330/306 |
| 5,412,347 | 5/1995 | Minnis | 330/286 |
| 5,469,107 | 11/1995 | Kohno | 330/277 |
| 5,491,450 | 2/1996 | Helms et al. | 330/277 |
| 5,532,650 | 7/1996 | Igarashi | 330/311 |
| 5,757,235 | 5/1998 | Fujiwara et al. | 330/277 |
| 5,809,408 | 9/1998 | Fujimoto et al. | 330/129 |

FOREIGN PATENT DOCUMENTS 405315865A  11/1993  Japan .

*Primary Examiner*—Robert Pascal
*Assistant Examiner*—Khanh Van Nguyen
*Attorney, Agent, or Firm*—Ostrolenk, Faber, Gerb & Soffen, LLP

[57] ABSTRACT

Input matching is achieved for a high-frequency range having a center frequency of 0.8 GHz by a capacitor and a coil in an input matching circuit, and input matching is achieved for a high-frequency range having a center frequency of 1.9 GHz by another coil in the input matching circuit. Output matching is achieved for a high-frequency range having a center frequency of 0.8 GHz by a capacitor and a coil in an output matching circuit, and output matching is achieved for a high-frequency range having a center frequency of 1.9 GHz by another coil in the output matching circuit.

15 Claims, 20 Drawing Sheets

HIGH-FREQUENCY AMPLIFIER

BACKGROUND OF THE INVENTION

1. Field of the Invention

The present invention relates to a high-frequency amplifier suited to, for example, a mobile communication unit or satellite communication unit.

2. Description of the Related Art

For a mobile communication unit such as a portable telephone or a cordless phone, a communication radio wave in the frequency band (carrier frequency) dedicated to each type of communication is conventionally used. Therefore, the front ends of the receiver and the transmitter included in a portable phone are provided with a high-frequency amplifier for amplifying only high-frequency signals in a single frequency band specified for a communication radio wave.

A high-frequency amplifier according to a conventional technology will be described below by referring to FIG. 18 to FIG. 24.

With a block diagram shown in FIG. 18, a high-frequency amplifier according to a conventional technology will be described first. A high-frequency amplifier 1 is roughly formed of an amplifying circuit 7 described later, a single frequency matching circuit (input matching circuit) 4 connected between the input of the amplifying circuit 7 and an input terminal 2, and a single-frequency matching circuit (output matching circuit) 12 connected between the output of the amplifying circuit 7 and an output terminal 16.

The high-frequency amplifier 1 is provided for the receiver of a portable telephone handling a communication radio wave in the frequency band ranging from 1.8 GHz to 2.0 GHz. The configuration of the high-frequency amplifier 1 will be described below in detail by referring to FIG. 19.

The input terminal 2 of the high-frequency amplifier 1 is connected to, for example, an antenna of a portable telephone. When a communication radio wave is received, a high-frequency signal in the frequency band ranging from 1.8 GHz to 2.0 GHz is input to the input terminal 2.

A capacitor 3 is connected directly to the input terminal 2, and removes a DC component when the DC component is included in a high-frequency signal input to the input terminal 2. The capacitor 3 is set to have a capacitance which does not adversely affect a high-frequency signal input to the input terminal 2, that is, for example, set to about 20 pF.

An input matching circuit 4 for matching a high-frequency signal in the frequency band ranging from 1.8 GHz to 2.0 GHz includes a coil 5 connected between the capacitor 3 and the gate terminal G1 of an input transistor 8 described later, and a coil 6 connected between ground and the connection point E between the capacitor 3 and the coil 5.

The inductances of the coil 5 and the coil 6 are set such that input matching is performed for a high-frequency signal in the frequency band ranging from 1.8 GHz to 2.0 GHz. The inductance of the coil 5 is set to 12 nH, for example, and the inductance of the coil 6 is set to 10 nH.

An amplifying circuit 7 is connected to the output of the input matching circuit 4. The amplifying circuit 7 includes the input transistor 8, an output transistor 9 connected in cascade to the input transistor 8, a resistor 10, and a bypass capacitor 11. Field effect transistors (FETs) are used for the input transistor 8 and the output transistor 9. The resistor 10 and the bypass capacitor 11 form a self-bias circuit for applying a DC bias to a high-frequency signal which is input to the amplifying circuit 7. The resistance of the resistor 10 is set to 80 Ω, for example, and the capacitance of the bypass capacitor 11 is set to 100 pF.

An output matching circuit 12 for matching a high-frequency signal in the frequency band ranging from 1.8 GHz to 2.0 GHz is connected to the output of the amplifying circuit 7. The output matching circuit 12 includes a coil 13 connected between the drain terminal D2 of the output transistor 9 in the amplifying circuit 7 and a capacitor 15 described later, and a coil 14 connected at one end to the connection point F between the coil 13 and the capacitor 15. The other end of the coil 14 is connected to a power supply for supplying a fixed voltage Vd.

The inductances of the coil 13 and the coil 14 are set such that output matching is performed for a high-frequency signal in the frequency band ranging from 1.8 GHz to 2.0 GHz. The inductance of the coil 13 is set to 8.2 nH, for example, and the inductance of the coil 14 is set to 10 nH.

The input matching circuit 4 and the output matching circuit 12 have the structure of a single-frequency matching circuit for matching a single frequency.

A capacitor 15 is connected to the output of the output matching circuit 12, and removes a DC bias applied to a high-frequency signal when the high-frequency signal is amplified by the amplifying circuit 7. The capacitance of the capacitor 15 is set to a capacitance which does not adversely affect a high-frequency signal output from the output terminal 16, that is, for example, set to about 20 pF.

The output terminal 16 of the high-frequency amplifier 1 is provided outside the high-frequency amplifier 1 and connected to a signal processing circuit (not shown) for handling modulation and demodulation, or audio information.

The high-frequency amplifier according to the conventional technology has the above structure. The high-frequency amplifier 1 is configured such that it matches and amplifies only a high-frequency signal in the frequency band ranging from 1.8 GHz to 2.0 GHz. In other words, the high-frequency amplifier 1 is configured such that it reduces the noise factor as much as possible, increases the gain as much as possible, and reduces the input reflection coefficient and the output reflection coefficient as much as possible for a high-frequency signal in the frequency band ranging from 1.8 GHz to 2.0 GHz.

In FIG. 20, a characteristic curve "a" indicates the frequency characteristic of the noise factor in the high-frequency amplifier 1. In FIG. 21, a characteristic curve "b" indicates the frequency characteristic of the gain in the high-frequency amplifier 1. In FIG. 22, characteristic curves "c" and "d" indicate the frequency characteristics of the input reflection coefficient and the output reflection coefficient in the high-frequency amplifier 1. It is found from FIG. 20 to FIG. 22 that, at the frequency band ranging from 1.8 GHz to 2.0 GHz, the noise factor is minimum, the gain is maximum, and the input reflection coefficient and the output reflection coefficient are minimum.

As described above, the high-frequency amplifier 1 according to the conventional technology is configured such that it achieves a superior amplification effect only on a high-frequency signal in the frequency band ranging from 1.8 GHz to 2.0 GHz.

In another known high-frequency amplifier 1' shown in FIG. 23, a high-frequency amplifier in which the resistor 10 and the bypass capacitor 11 are omitted from the amplifying circuit 7 and one end of the coil 6 is not connected to ground but instead is connected to a fixed voltage Vd' of, for example, −0.7 V. This type of conventional technology also achieves a superior amplification effect on a high-frequency signal in the frequency band ranging from 1.8 GHz to 2.0 GHz.

The respective frequency bands of communication radio waves that are used in different areas may differ. For example, the frequency band of a communication radio wave used in one area may be 1.8 GHz to 2.0 GHz whereas that used in another area may be 0.7 GHz to 1.0 GHz.

The high-frequency amplifier 1 according to the conventional technology described above amplifies only a high-frequency signal in a single frequency band. Therefore, to implement a portable telephone which handles a plurality of communication radio waves in different frequency bands (that is, a common portable telephone usable in a plurality of areas), the portable telephone needs to be equipped with a plurality of high-frequency amplifiers 1 each corresponding to a respective frequency band. As a result, the portable telephone becomes large, power consumption increases, and cost also increases.

Since the high-frequency amplifier 1 according to the conventional technology is used in a mobile communication unit, the characteristic curve of input power level vs. output power level needs to provide low distortion and high sound quality. To this end, an intercept point P, which indicates the quality of the characteristic of input power level vs. output power level, must be good, as will be discussed further below.

The intercept point P will be described below. A single-frequency signal is input to the input end of the high-frequency amplifier 1 used in a conventional mobile communication unit. The single-frequency signal actually includes, however, a plurality of high-frequency signals within a very narrow band, such as a 1.9003-GHz signal, a 1.9006-GHz signal, and a 1.9009-GHz signal, used as information carriers. Thus, in effect, a plurality of high-frequency signals are input to the high-frequency amplifier 1.

When two adjacent high-frequency signals, such as a 1.9003-GHz signal and a 1.9006-GHz signal, having the same input power level, are input to the high-frequency amplifier 1, for example, the high-frequency amplifier 1 outputs the fundamental-wave signals having the same waveform corresponding to the two high-frequency signals amplified by the high-frequency amplifier 1, and also outputs third intermodulation wave signals having a distorted waveform caused by mixing the two high-frequency signals in the high-frequency amplifier 1.

As shown in FIG. 24, the horizontal axis represents an input power level and the vertical axis represents the output power levels of the fundamental-wave signal and the third intermodulation waveform-distorted wave signal corresponding to an input power level. A characteristic curve "e" for the fundamental-wave signal indicates the relationship between the input power level and the output power level of the fundamental-wave signal. A characteristic curve "f" for the third intermodulation waveform-distorted wave signal indicates the relationship between the input power level and the output power level of the third intermodulation signal. The characteristic curves "e" and "f" show linearity in a zone A where the input power level is low, and are distorted and show saturation in a zone B where the input power level is high.

The intercept point P is an intersection obtained by extrapolating the straight sections of the characteristic curves "e" and "f" in the zone A, where the input power level is low. A good intercept point P means that the input power level (hereinafter called input intercept point) and the output power level (hereinafter called output intercept point) specified by the intercept point P are large. In other words, a good intercept point P means that the characteristic curves "e" and "f" of the high-frequency amplifier 1 are not distorted in the zone B, where the input power level is high, and have good linearity.

In the high-frequency amplifier 1 according to the conventional technology, the values of the components in the output matching circuit 12 are set in order to achieve impedance matching for a high-frequency signal output from the output terminal 16. The values of the components in the output matching circuit 12 are also specified in order to improve the intercept point P. However, it is difficult to satisfy both characteristics at the same time just by setting the values of the components in the output matching circuit 12, and the stability of the high-frequency amplifier 1 can be decreased.

SUMMARY OF THE INVENTION

Accordingly, the present invention provides a high-frequency amplifier which amplifies a plurality of high-frequency signals having different frequencies and which contributes to size reduction, power saving, and cost reduction of a communication unit in which the high-frequency amplifier is used.

The present invention also provides a high-frequency amplifier having a good intercept point and increased linearity without causing either a noise matching condition adjusted by the input matching circuit or an impedance matching condition adjusted by the output matching circuit to deteriorate.

According to a first aspect of the present invention, a high-frequency amplifier includes: an amplifying circuit; an input matching circuit connected between the input of the amplifying circuit and an input terminal; and an output matching circuit connected between the output of the amplifying circuit and an output terminal, wherein the matching circuit includes a capacitor connected to the input terminal, a first coil connected between the capacitor and the amplifying circuit, and a second coil connected to the connection point of the capacitor and the first coil. The capacitor and the second coil form a lower-band frequency matching circuit for achieving matching for a lower-band high-frequency signal, and the first coil forms a higher-band frequency matching circuit for achieving matching for a higher-band high-frequency signal which is higher in frequency than the lower-band high-frequency signal. Therefore, input matching is achieved for a plurality of high-frequency signals (lower-band high-frequency signal and higher-band high-frequency signal) having different frequencies, and the noise factor, the reflection coefficients, and the gain are optimized for each high-frequency signal. Therefore, by providing one high-frequency amplifier at the front end of a communication unit handling a plurality of communication radio waves having different frequencies, each communication radio wave can be amplified. Size reduction, power saving, and cost reduction can be implemented for the communication unit.

The high-frequency amplifier may be configured such that the inductance of the second coil in the input matching circuit is set such that the second coil is open for the higher-band high-frequency signal when the second coil is viewed from the connection point of the capacitor and the first coil in the input matching circuit, the capacitance of the capacitor in the input matching circuit is set such that matching is achieved for the lower-band high-frequency signal, and the inductance of the first coil in the input matching circuit is set such that matching is achieved for the higher-band high-frequency signal. Therefore, input matching is achieved for both the higher-band high-frequency signal and the lower-band high-frequency signal, and each high-frequency signal is efficiently amplified by one amplifying circuit.

According to the first aspect of the present invention, further, a high-frequency amplifier includes: an amplifying circuit; an input matching circuit connected between the input of the amplifying circuit and an input terminal; and an output matching circuit connected between the output of the amplifying circuit and an output terminal, wherein the output matching circuit includes a first coil connected to the output of the amplifying circuit, a capacitor connected between the first coil and the output terminal, and a second coil connected to the connection point of the first coil and the capacitor. The capacitor and the second coil form a lower-band frequency matching circuit for achieving matching for a lower-band high-frequency signal, and the first coil forms a higher-band frequency matching circuit for achieving matching for a higher-band high-frequency signal which is higher in frequency than the lower-band high-frequency signal. Therefore, output matching is achieved for a plurality of high-frequency signals having different frequencies, and the noise factor, the reflection coefficients, and the gain are optimized for each high-frequency signal. Therefore, by providing one high-frequency amplifier at the front end of a communication unit handling a plurality of communication radio waves having different frequencies, each communication radio wave can be amplified. Size reduction, power saving, and cost reduction can be implemented for the communication unit.

According to a second aspect of the invention, the high-frequency amplifier may be configured such that the amplifying circuit includes an input transistor of which the base terminal is connected to the output of the input matching circuit and the emitter terminal is at least AC-connected to ground, an output transistor of which the emitter terminal is connected to the collector terminal of the input transistor and the collector terminal is connected to the input of the output matching circuit, and voltage applying means connected to the base terminal of the output transistor for applying a voltage to the base terminal of the output transistor, wherein the voltage applying means changes a voltage applied to the base terminal of the output transistor according to the frequency of a high-frequency signal amplified by the amplifying circuit. In this case, matching is successfully achieved for a plurality of high-frequency signals having different frequencies.

More particularly, the high-frequency amplifier may be configured such that the voltage source in the amplifying circuit specifies a voltage applied to the base terminal of the output transistor such that the minimum input reflection coefficient and the minimum output reflection coefficient are obtained for the higher-band high-frequency signal when the higher-band high-frequency signal is amplified, and specifies a voltage applied to the base terminal of the output transistor such that the minimum input reflection coefficient and the minimum output reflection coefficient are obtained for the lower-band high-frequency signal when the lower-band high-frequency signal is amplified. In this case, by setting the input reflection coefficient and the output reflection coefficient as small as possible for a plurality of high-frequency signals having different frequencies, the input reflection characteristic and the output reflection characteristic are optimized for each high-frequency signal.

According to a third aspect of the invention, the high-frequency amplifier may be configured such that an impedance circuit is provided between the input transistor and the output transistor in the amplifying circuit. In this case, the values of components constituting the impedance circuit are changed to change the intercept point. The values in the impedance circuit are set such that a satisfactory intercept point is obtained. With these settings, the gain is increased and the noise factor, the input reflection coefficient and the output reflection coefficient are suppressed to low levels, and also, the linearity of the high-frequency amplifier is improved.

The high-frequency amplifier may be configured such that the impedance circuit is formed of a coil. In this case, the inductance of the coil is changed to change the intercept point. By setting the inductance of the coil such that a satisfactory intercept point is obtained, the linearity of the high-frequency amplifier is increased.

When the inductance of the coil is changed, the intercept point changes. When the inductance of the coil is set such that the intercept point is satisfactory, a characteristic curve for the fundamental-wave signal and a characteristic curve for the third intermodulation waveform-distorted wave signal in the high-frequency amplifier come to have good linearity.

The high-frequency amplifier may be configured such that field effect transistors are used for the input transistor and the output transistor in the amplifying circuit. In this case, the linearity of the high-frequency amplifier is improved.

In addition to the foregoing amplifier circuits, the invention also relates to the methods carried by the apparatus disclosed herein.

The above, and other aspects, features and advantages of the invention will be better understood from the following detailed description, read in conjunction with the drawings.

DETAILED DESCRIPTION

The foregoing basic aspects of the invention will now be discussed in more detail.

Figure 1:
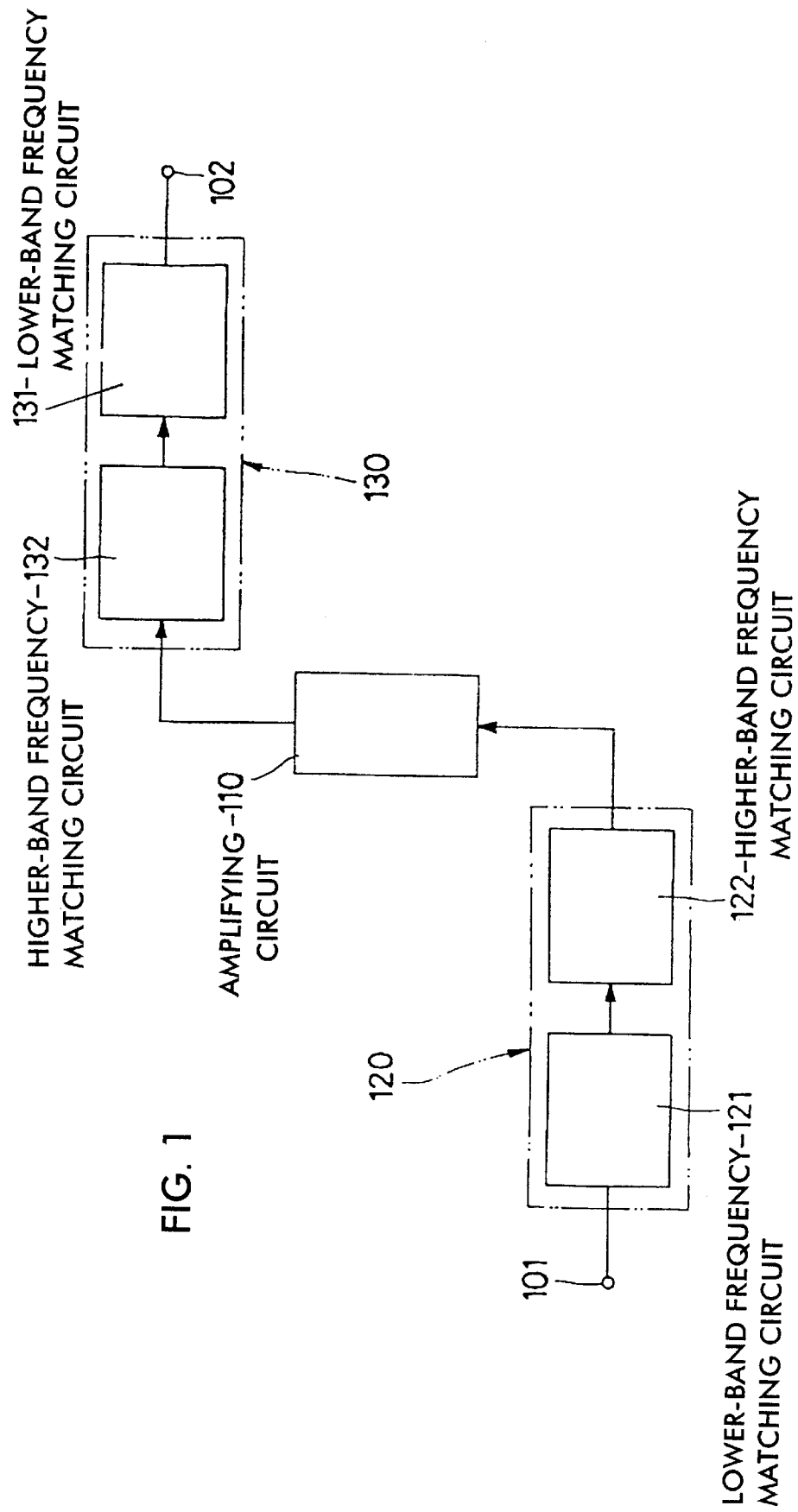
FIG. 1 is a functional block diagram illustrating a first aspect of the present invention.

To describe the first aspect of the invention more specifically, a functional block diagram shown in FIG. 1 will be used. A high-frequency amplifier according to the present invention includes an amplifying circuit 110, an input matching circuit 120 connected between the input of the amplifying circuit 110 and an input terminal 101, and an output matching circuit 130 connected between the output of the amplifying circuit 110 and an output terminal 102. The input matching circuit 120 includes a capacitor connected to the input terminal 101, a first coil connected between the capacitor and the amplifying circuit 110, and a second coil connected to the connection point of the capacitor and the first coil. The capacitor and the second coil form a lower-band frequency matching circuit 121 for matching a lower-band high-frequency signal, and the first coil forms a higher-band frequency matching circuit 122 for matching a higher-band high-frequency signal, which is higher in frequency than the lower-band high-frequency signal.

With this configuration, between two high-frequency signals having different frequencies, namely the lower-band high-frequency signal and the higher-band high-frequency signal, the lower-band frequency matching circuit 121 achieves input matching for the lower-band high-frequency signal and the higher-band frequency matching circuit 122 achieves input matching for the higher-band high-frequency signal. In other words, when a higher-band high-frequency signal is input to the high-frequency amplifier, the noise factor and the input reflection coefficient for the higher-band high-frequency signal can be reduced, for example, and the gain therefor can be increased. When a lower-band high-frequency signal is input to the high-frequency amplifier, the noise factor and the input reflection coefficient for the lower-band high-frequency signal can be reduced, for example, and the gain therefor can be increased. Therefore, one amplifying circuit efficiently amplifies two high-frequency signals having different frequencies.

To be more specific, in FIG. 1, the inductance of the second coil in the input matching circuit 120 is set such that it is open to a higher-band high-frequency signal when the second coil is viewed from the connection point of the capacitor and the first coil in the input matching circuit, the capacitance of the capacitor in the input matching circuit 120 is set such that it matches a lower-band high-frequency signal, and the inductance of the first coil in the input matching circuit 120 is set such that it matches a higher-band high-frequency signal.

As described above, the inductance of the second coil in the input matching circuit 120 is set such that it is open to a higher-band high-frequency signal when the second coil is viewed from the connection point, and the capacitance of the capacitor in the input matching circuit 120 is adjusted such that the noise factor and the input reflection coefficient for a lower-band high-frequency signal is reduced, for example, and the gain therefor is increased. Then, input matching is achieved for the lower-band high-frequency signal.

In the condition in which the inductance of the second coil and the capacitance of the capacitor are specified as described above, the inductance of the first coil in the input matching circuit 120 is adjusted such that the noise factor and the input reflection coefficient for a higher-band high-frequency signal are reduced, for example, and the gain therefor is increased. Then, input matching is achieved for the higher-band high-frequency signal.

As described above, input matching is achieved for a higher-band high-frequency signal by the first coil constituting the higher-band frequency matching circuit 122, and input matching is achieved for a lower-band high-frequency signal by the capacitor and the second coil constituting the lower-band frequency matching circuit 121.

Also in FIG. 1, the output matching circuit 130 includes a first coil connected to the output of the amplifying circuit 110, a capacitor connected between the first coil and an output terminal 102, and a second coil connected to the connection point of the first coil and the capacitor. The capacitor and the second coil form a lower-band frequency matching circuit 131 for matching a lower-band high-frequency signal, and the first coil forms a higher-band frequency matching circuit 132 for matching a higher-band high-frequency signal, which is higher in frequency than the lower-band high-frequency signal.

With this configuration, output matching is achieved for two high-frequency signals having different frequencies. When a higher-band high-frequency signal is input to the high-frequency amplifier, the noise factor and the input reflection coefficient for the higher-band high-frequency signal can be reduced, for example, and the gain therefor can be increased, by the higher-band frequency matching circuit 132. When a lower-band high-frequency signal is input to the high-frequency amplifier, the noise factor and the input reflection coefficient for the lower-band high-frequency signal can be reduced, for example, and the gain therefor can be increased, by the lower-band frequency matching circuit 131.

The high-frequency amplifier may be configured such that the inductance of the second coil in the output matching circuit is set such that the second coil is open for the higher-band high-frequency signal when the second coil is viewed from the connection point of the capacitor and the first coil in the output matching circuit, the capacitance of the capacitor in the output matching circuit is set such that matching is achieved for the lower-band high-frequency signal, and the inductance of the first coil in the output matching circuit is set such that matching is achieved for the higher-band high-frequency signal. In this case, output matching is achieved for both the higher-band high-frequency signal and the lower-band high-frequency signal, and each high-frequency signal is efficiently amplified by one amplifying circuit.

To be more specific, in FIG. 1, the inductance of the second coil in the output matching circuit 130 is set such that it is open to a higher-band high-frequency signal when the second coil is viewed from the connection point of the capacitor and the first coil in the output matching circuit 130, the capacitance of the capacitor in the output matching circuit 130 is set such that it matches a lower-band high-frequency signal, and the inductance of the first coil in the output matching circuit 130 is set such that it matches a higher-band high-frequency signal.

As described above, the inductance of the second coil in the output matching circuit 130 is set such that it is open to a higher-band high-frequency signal when the second coil is viewed from the connection point, and the capacitance of the capacitor in the output matching circuit 130 is adjusted such that the noise factor and the input reflection coefficient for a lower-band high-frequency signal is reduced, for example, and the gain therefor is increased. Then, output matching is achieved for the lower-band high-frequency signal.

In the condition in which the inductance of the second coil and the capacitance of the capacitor are specified as described above, the inductance of the first coil in the output matching circuit 130 is adjusted such that the noise factor and the input reflection coefficient for a higher-band high-frequency signal is reduced, for example, and the gain therefor is increased. Then, output matching is achieved for the higher-band high-frequency signal.

As described above, matching is achieved for a higher-band high-frequency signal by the first coil constituting the higher-band frequency matching circuit 132, and matching is achieved for a lower-band high-frequency signal by the capacitor and the second coil constituting the lower-band frequency matching circuit 131.

Figure 2:
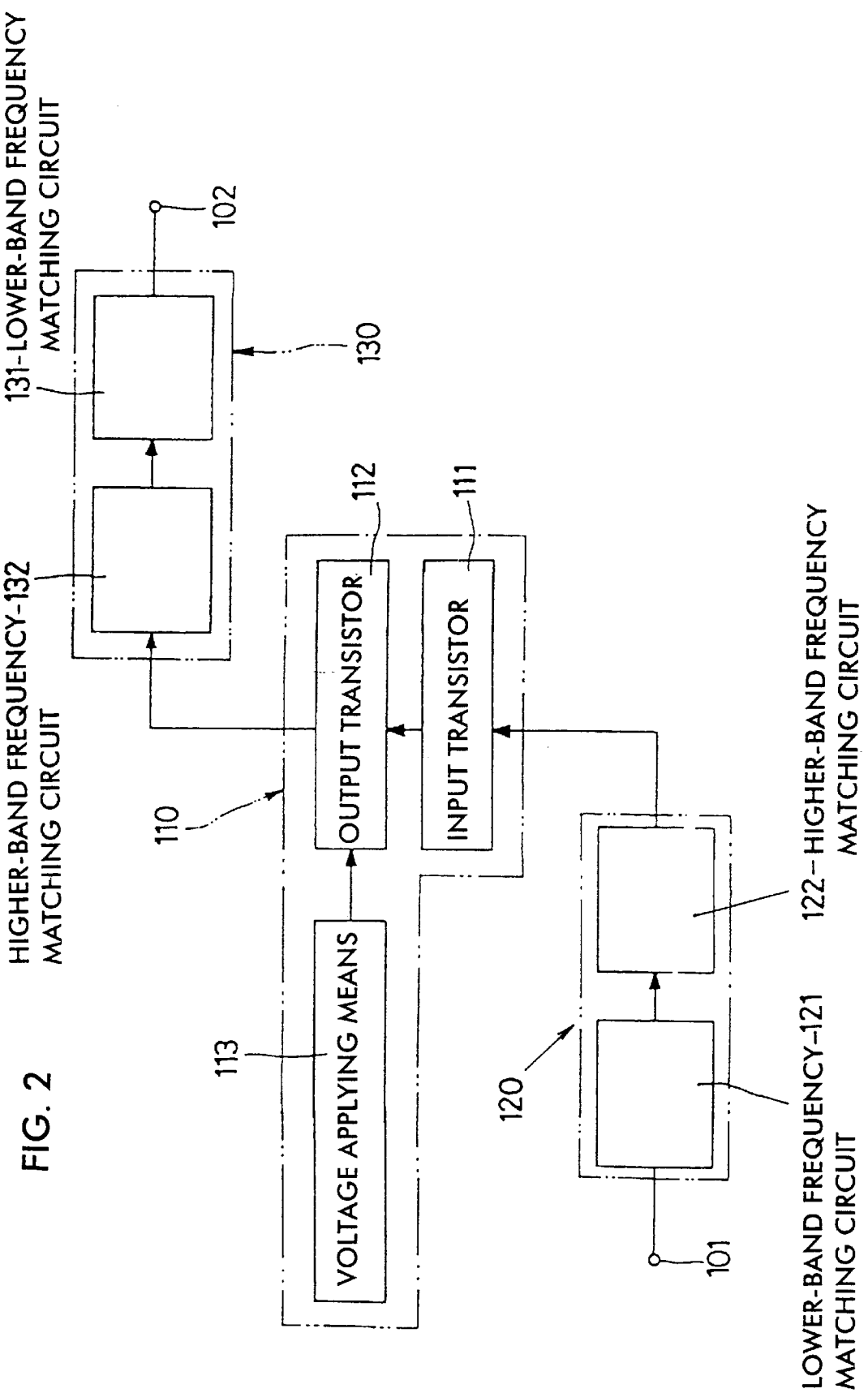
FIG. 2 is a functional block diagram illustrating a second aspect of the present invention.

The second aspect of the invention is shown more specifically in FIG. 2. An amplifying circuit 110 includes an input transistor 111 of which the base terminal is connected to the output of an input matching circuit and the emitter terminal is at least AC-connected to ground; an output transistor 112 of which the emitter terminal is connected to the collector terminal of the input transistor 111 and the collector terminal is connected to the input of an output matching circuit 130; and a voltage source 113 connected to the base terminal of the output transistor 112 for applying a voltage to the base terminal of the output transistor 112, and the voltage source 113 changes the voltage applied to the base terminal of the output transistor 112 according to the frequency of a high-frequency signal amplified by the amplifying circuit 110.

With this structure, when the voltage applied to the base terminal of the output transistor 112 is changed, the impedance between ground and the base terminal of the input transistor 111 changes and the impedance between ground and the collector terminal of the output transistor 112 also changes. Therefore, by changing the voltage applied to the base terminal of the output transistor 112, the noise factor, the input reflection coefficient, the output reflection coefficient, and the gain for the high-frequency amplifier are changed.

To amplify a higher-band high-frequency signal in the amplifying circuit 110, the voltage applied to the base terminal of the output transistor 112 is changed by the voltage source 113 such that the noise factor, the input reflection coefficient, the output reflection coefficient, and the gain for the higher-band high-frequency signal are optimal. To amplify a lower-band high-frequency signal, the voltage applied to the base terminal of the output transistor 112 is changed by the voltage source 113 such that the noise factor, the input reflection coefficient, the output reflection coefficient, and the gain for the lower-band high-frequency signal are optimal. Therefore, input matching and output matching are successfully achieved for both higher-band and lower-band high-frequency signals.

By adjusting the voltage applied to the base terminal of the output transistor 112 by the voltage source 113, input matching and output matching can also be achieved for a high-frequency signal having a frequency other than those of the higher-band high-frequency signals and the lower-band high-frequency signals.

To be more specific, in FIG. 2, the voltage source 113 of the amplifying circuit 110 is configured so that the voltage applied to the base terminal of the output transistor 112 is set such that the input reflection coefficient and the output reflection coefficient for a higher-band high-frequency signal are minimum when the higher-band high-frequency signal is amplified, and such that the input reflection coefficient and the output reflection coefficient for a lower-band high-frequency signal are minimum when the lower-band high-frequency signal is amplified. With this structure, the input reflection characteristic and the output reflection characteristic are successfully optimized for both higher-band and lower-band high-frequency signals.

Figure 3:
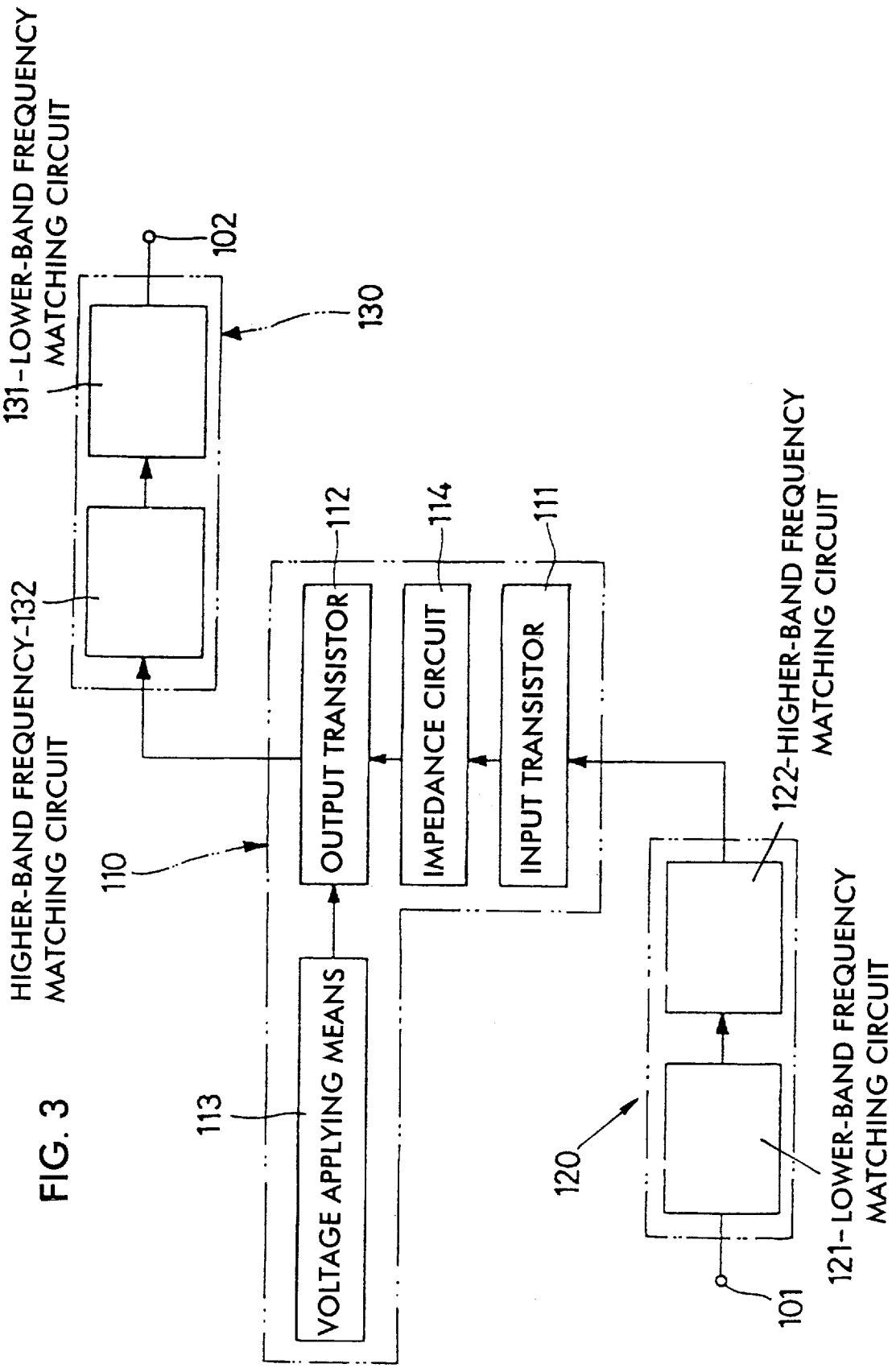
FIG. 3 is a functional block diagram illustrating a third aspect of the present invention.
Figure 4:
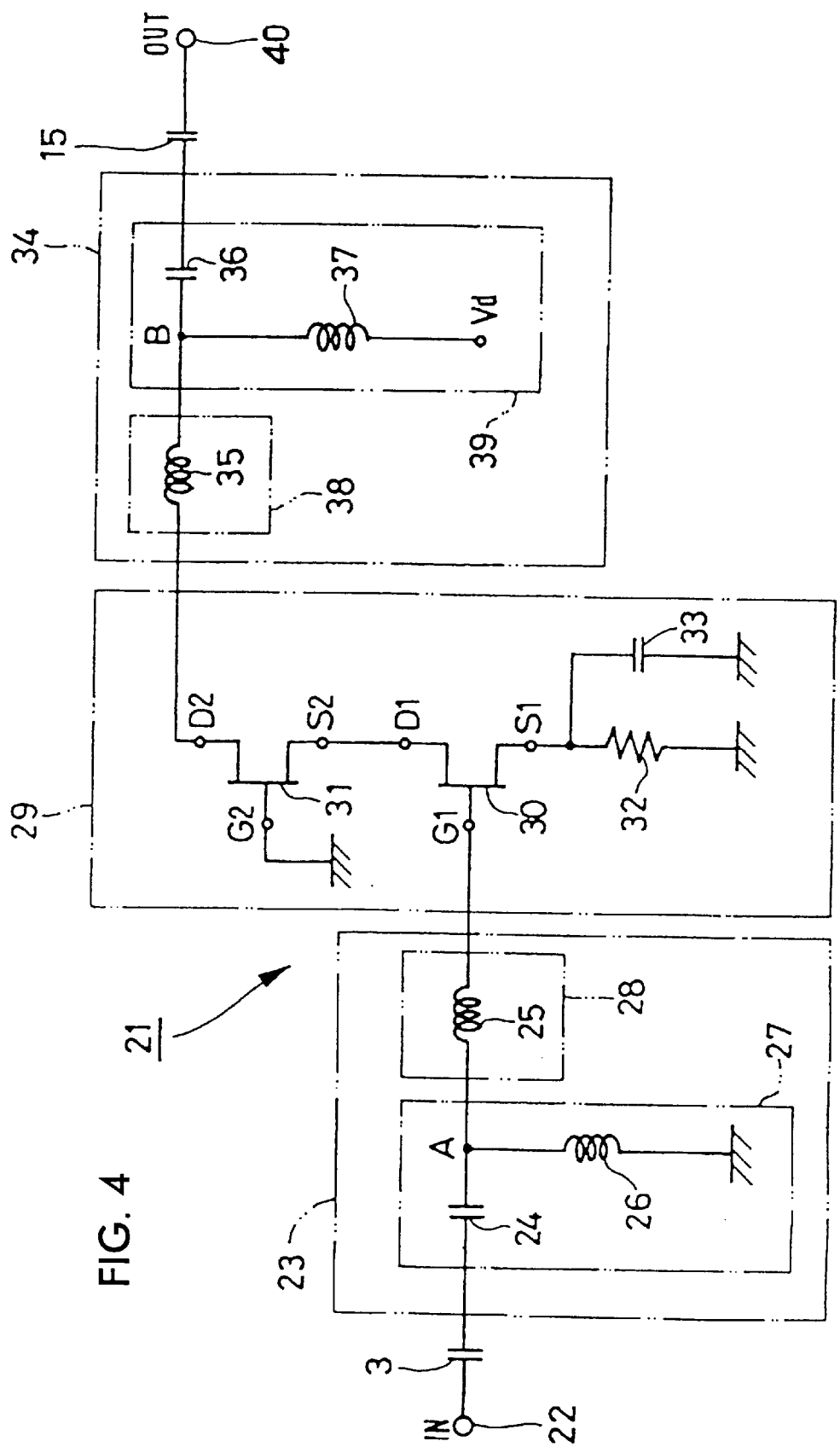
FIG. 4 is a circuit diagram of a high-frequency amplifier according to a first embodiment of the present invention.

The third aspect of the invention is shown more specifically in FIG. 3. An impedance circuit 114 is provided between the input transistor 111 and the output transistor 112 in the amplifying circuit 110.

In the impedance circuit 114 connected between the input transistor 111 and the output transistor 112, an intercept point is changed according to the values of the components constituting the impedance circuit 114. The values of the components constituting the impedance circuit 114 are set such that the intercept point has the best value. As a result, a characteristic curve for the fundamental-wave signal and a characteristic curve for the third intermodulation waveform-distorted wave signal in the high-frequency amplifier come to have good linearity. Since this impedance circuit 114 is connected between the input transistor 111 and the output transistor 112, the electrical characteristics of the high-frequency amplifier, such as the gain, the noise factor, the input reflection loss, and the output reflection loss, do not deteriorate.

To be more specific, in FIG. 3, the impedance circuit 114 is formed of a coil.

Also, in FIG. 3, field effect transistors may be used for the input transistor 111 and the output transistor 112 of the amplifying circuit 110, as well as in the circuits shown in FIGS. 1 and 2.

In other words, the amplifying circuit 110 in FIG. 3 includes the input transistor 111 of which the gate terminal is connected to the output of the input matching circuit and the source terminal is AC-connected to ground; the output transistor 112 of which the gate terminal is connected to the drain terminal of the input transistor 111 and the drain terminal is connected to the input of the output matching circuit 130; and the voltage applying means 113 connected to the gate terminal of the output transistor 112 for applying a voltage to the gate terminal of the output transistor 112. The voltage applying means 113 changes the voltage applied to the gate terminal of the output transistor 112 according to the frequency of a high-frequency signal amplified by the amplifying circuit 110.

High-frequency amplifiers according to embodiments of the present invention will be described below in detail by referring to the attached drawings.

First Embodiment

FIG. 4 to FIG. 7 show a high-frequency amplifier according to a first embodiment of the present invention. In the figures, a high-frequency amplifier 21 is provided for the receiver of a common portable telephone handling two communication radio waves, a communication radio wave within a frequency band of 1.8 GHz to 2.0 GHz and a communication radio wave within a frequency band of 0.7 GHz to 1.0 GHz.

The input terminal 22 of the high-frequency amplifier 21 is connected, for example, to an antenna of a portable telephone. A higher-band high-frequency signal having a frequency band of 1.8 GHz to 2.0 GHz (hereinafter called a higher-band receiving signal) and a lower-band high-frequency signal having a frequency band of 0.7 GHz to 1.0 GHz (hereinafter called lower-band receiving signal) are input to the input terminal 22 correspondingly to the communication radio wave received.

An input matching circuit 23 is connected to the input terminal 22 through a capacitor 3 and is configured such that it matches both higher-band receiving and lower-band receiving signals. The input matching circuit 23 includes a capacitor 24, a coil 25 connected between the capacitor 24 and the gate terminal G1 of an input transistor 30 described later, and a coil 26 connected between ground and the connection point A of the capacitor 24 and the coil 25.

The capacitor 24 and the coil 26 form a lower-band matching section 27 for matching a lower-band receiving signal. The coil 25 forms a higher-band matching section 28 for matching a higher-band receiving signal.

When a high-frequency signal input to the input terminal 22 includes a DC component, the capacitor 3 removes the DC component.

The settings of the capacitance of the capacitor 24 and the inductances of the coils 25 and 26 all constituting the input matching circuit 23 will be described below.

The inductance of the coil 26 is set such that the connection between the connection point A and ground is open at a frequency band of 1.8 GHz to 2.0 GHz when the coil 26 is viewed from the connection point A. In other words, the inductance of the coil 26 is set such that the impedance between the connection point A and ground is as high as possible at a higher-band receiving signal in a frequency band of 1.8 GHz to 2.0 GHz. In the present embodiment, the inductance of the coil 26 is set, for example, to about 12 nH.

The capacitance of the capacitor 24 is then set such that matching is achieved for a lower-band receiving signal in a frequency band of 0.7 GHz to 1.0 GHz. In other words, the capacitance of the capacitor 24 is set such that the noise factor and the input reflection coefficient are reduced as much as possible, for example, and the gain of the high-frequency amplifier 21 is increased as much as possible when a lower-band receiving signal is input to the high-frequency amplifier 21. In the present embodiment, the capacitance of the capacitor 24 is set, for example, to about 1.5 pF.

The inductance of the coil 25 constituting the higher-band matching section 28 is set such that matching is achieved for a higher-band receiving signal in a frequency band of 1.8 GHz to 2.0 GHz. In other words, the inductance of the coil 25 is set such that the noise factor and the input reflection coefficient are reduced as much as possible, for example, and the gain of the high-frequency amplifier 21 is increased as much as possible when a higher-band receiving signal is input to the high-frequency amplifier 21. In the present embodiment, the inductance of the coil 25 is set, for example, to about 10 nH.

In the condition in which, as described above, the inductance of the coil 26 is set such that the connection is open at the frequency band of a higher-band receiving signal when the coil 26 is viewed from the connection point A, matching is achieved for a higher-band receiving signal just by adjusting the inductance of the coil 25. The capacitance of the capacitor 24 is set, for example, to as small as 1.5 pF as described above. Even when the capacitor 24 has such a small capacitance, a loss does not occur in the frequency band of a higher-band receiving signal.

An amplifying circuit 29 is connected to the output of the input matching circuit 23 and includes an input transistor 30, an output transistor 31 connected in cascade to the input transistor 30, a resistor 32, and a bypass capacitor 33.

The input transistor 30 is formed of a field effect transistor (FET). The gate terminal G1 thereof is connected to the coil 25 of the input matching circuit 23, the drain terminal D1 is connected to the source terminal S2 of the output transistor 31, and the source terminal S1 is connected to a resistor 32. The source terminal S1 is also connected to ground through a bypass capacitor 33. This means that the source terminal S1 of the input transistor 30 is AC-connected to ground.

The output transistor 31 is formed of a field effect transistor. The gate terminal G2 thereof is connected to ground, the source terminal S2 is connected to the drain terminal D1 of the input transistor 30, and the drain terminal D2 is connected to the coil 35 of an output matching circuit 34.

The resistor 32 and the bypass capacitor 33 form a self-bias circuit for applying a DC bias to a higher-band receiving signal and a lower-band receiving signal input to the amplifying circuit 29. The resistance of the resistor 32 is, for example, set to 80 Ω and the capacitance of the bypass capacitor 33 is, for example, set to 100 pF.

The output matching circuit 34 is connected to the output of the amplifying circuit 29 and achieves matching for both higher-band and lower-band receiving signals. The output matching circuit 34 includes a coil 35 connected to the drain terminal D2 of the output transistor 31, a capacitor 36 connected to the coil 35, and a coil 37 connected to the connection point B between the coil 35 and the capacitor 36 at one end. A fixed voltage Vd is applied to the other end of the coil 37.

The coil 35 forms a higher-band matching section 38 for matching a higher-band receiving signal. The capacitor 36 and the coil 37 form a lower-band matching section 39 for matching a lower-band receiving signal.

The settings of the capacitance of the capacitor 36, and the inductances of the coil 35 and the coil 37 constituting the output matching circuit 34 will be described below.

The inductance of the coil 37 is set, for example, to 10 nH such that the coil 37 is open at a frequency band of 1.8 GHz to 2.0 GHz when the coil 37 is viewed from the connection point B.

The capacitance of the capacitor 36 is set in the same way as for the capacitor 24 in the input matching circuit 23 such that matching is achieved for a lower-band receiving signal in a frequency band of 0.7 GHz to 1.0 GHz. In other words, the capacitance of the capacitor 24 is set such that the noise factor and the output reflection coefficient are reduced as much as possible, for example, and the gain of the high-frequency amplifier 21 is increased as much as possible when a lower-band receiving signal is input to the high-frequency amplifier 21. In the present embodiment, the capacitance of the capacitor 36 is set, for example, to about 3 pF. The capacitance of the capacitor 36 needs to be set, with impedance matching for a subsequent signal processing circuit (not shown) connected to an output terminal 40 being taken into account.

The inductance of the coil 35 is set in the same way as for the coil 25 in the input matching circuit 23 such that matching is achieved for a higher-band receiving signal in a frequency band of 1.8 GHz to 2.0 GHz. In other words, the inductance of the coil 35 is set such that the noise factor and the output reflection coefficient are reduced as much as possible, for example, and the gain of the high-frequency amplifier 21 is increased as much as possible when a higher-band receiving signal is output from the amplifying circuit 29 to the output matching circuit 34. In the present embodiment, the inductance of the coil 35 is set, for example, to about 8.2 nH. The inductance of the coil 35 needs to be set, with impedance matching for a subsequent signal processing circuit (not shown) connected to an output terminal 40 being taken into account.

In the condition in which, as described above, the inductance of the coil 37 is set such that the coil 37 is open at the frequency band of a higher-band receiving signal when the coil 37 is viewed from the connection point B, matching is achieved for a higher-band receiving signal just by adjusting the inductance of the coil 35. The capacitance of the capacitor 36 is set, for example, to as small as 3 pF as described above. Even when the capacitor 36 has such a small capacitance, a loss does not occur in the frequency band of a higher-band receiving signal.

An output terminal 40 of the high-frequency amplifier 21 is connected to the output matching circuit 34 through a capacitor 15. The capacitor 15 removes a DC bias component added to a high-frequency signal when the signal is amplified. The output terminal 40 is connected to a signal processing circuit (not shown) for handling modulation and demodulation, and sound information.

The operation of the high-frequency amplifier 21 having the above structure will next be described.

When a communication radio wave in a frequency band of 1.8 GHz to 2.0 GHz is received through the antenna of a portable telephone, the communication radio wave is input to the input matching circuit 23 through the input terminal 22 of the high-frequency amplifier 21 as a higher-band receiving signal. Matching is achieved for this higher-band receiving signal by the coil 25 in the input matching circuit 23, and the signal is amplified in the amplifying circuit 29. Matching is further achieved for this higher-band receiving signal by the coil 35 in the output matching circuit 34 and the signal is output from the output terminal 40 to the subsequent signal processing circuit.

When a communication radio wave in a frequency band of 0.7 GHz to 1.0 GHz is received through the antenna of the portable telephone, the communication radio wave is input to the input matching circuit 23 through the input terminal 22 of the high-frequency amplifier as a lower-band receiving signal. Matching is achieved for this lower-band receiving signal by the capacitor 24 and the coil 26 in the input matching circuit 23, and the signal is amplified in the amplifying circuit 29. Matching is further achieved for this lower-band receiving signal by the capacitor 36 and the coil 37 in the output matching circuit 34 and the signal is output from the output terminal 40 to the subsequent signal processing circuit.

Thus, a single input matching circuit 23 and a single output matching circuit 34 achieve input matching and output matching for two high-frequency signals having different frequencies, that is, a lower-band receiving signal and a higher-band receiving signal, and one amplifying circuit 29 optimally amplifies the lower-band receiving signal and the higher-band receiving signal.

Figure 5:
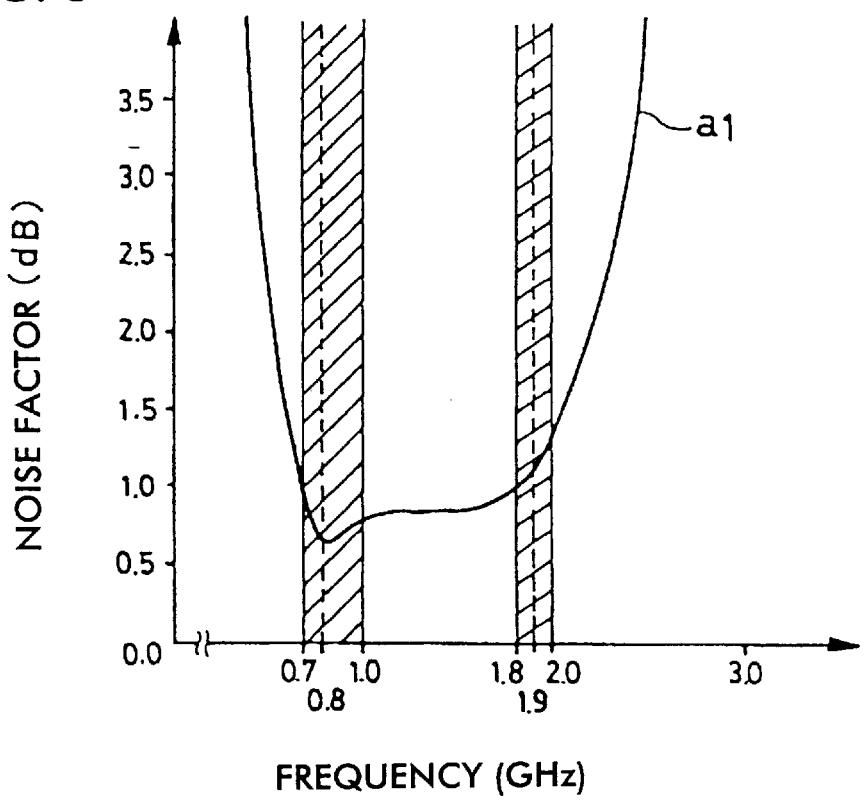
FIG. 5 is a characteristic-curve chart showing the frequency characteristic of the noise factor of the high-frequency amplifier.
Figure 6:
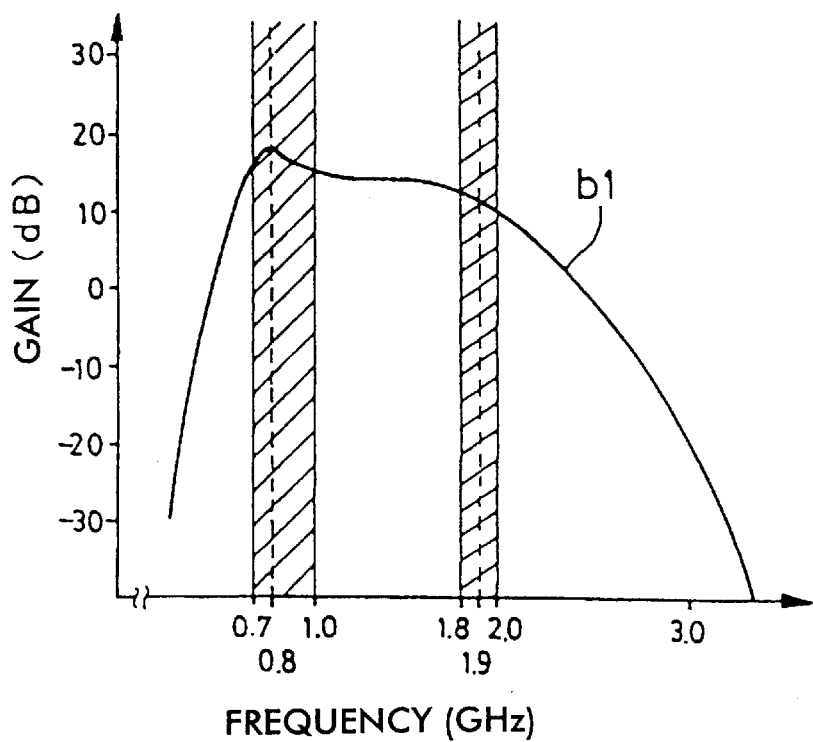
FIG. 6 is a characteristic-curve chart showing the frequency characteristic of the gain of the high-frequency amplifier.
Figure 7:
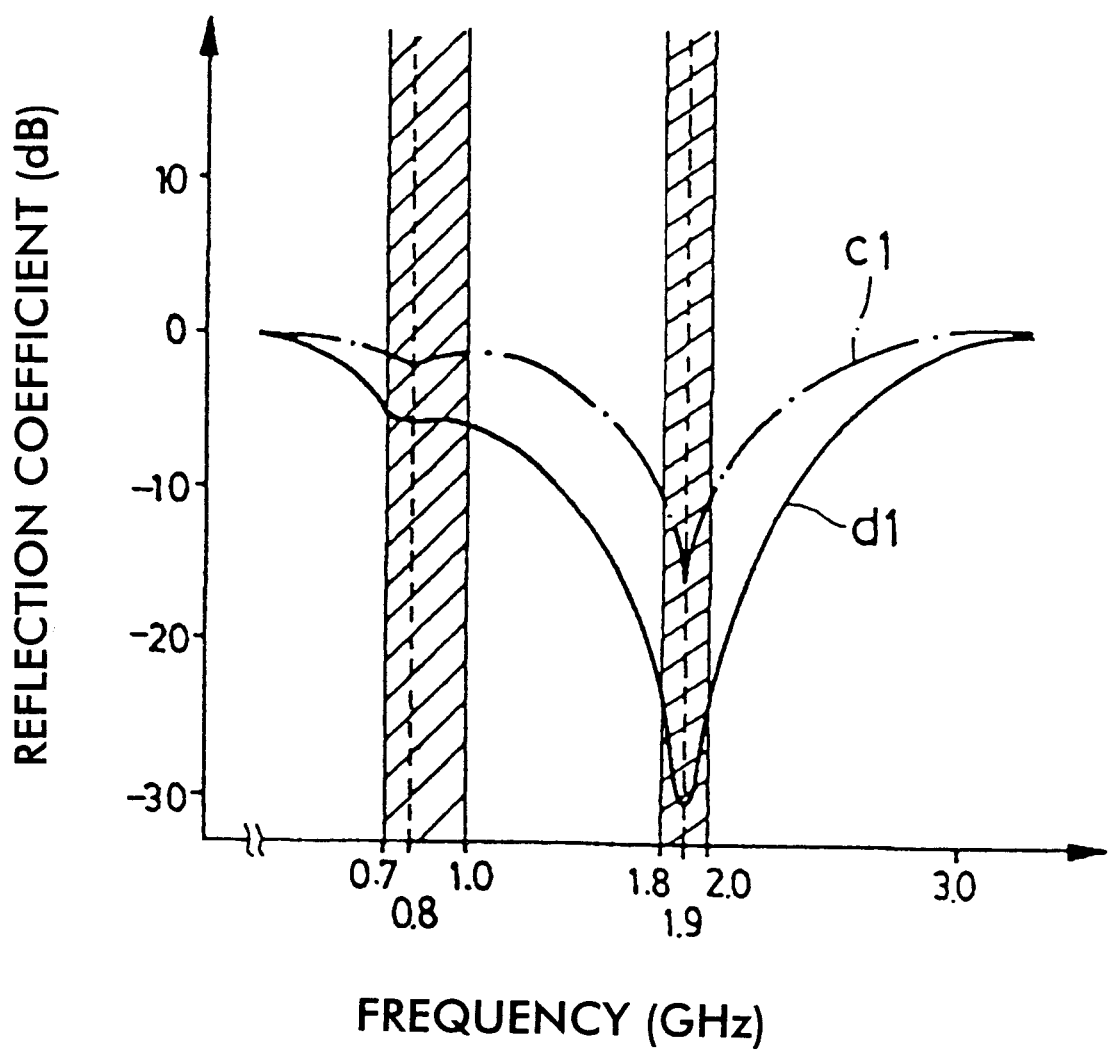
FIG. 7 is a characteristic-curve chart showing the frequency characteristics of the input reflection coefficient and the output reflection coefficient of the high-frequency amplifier.
Figure 8:
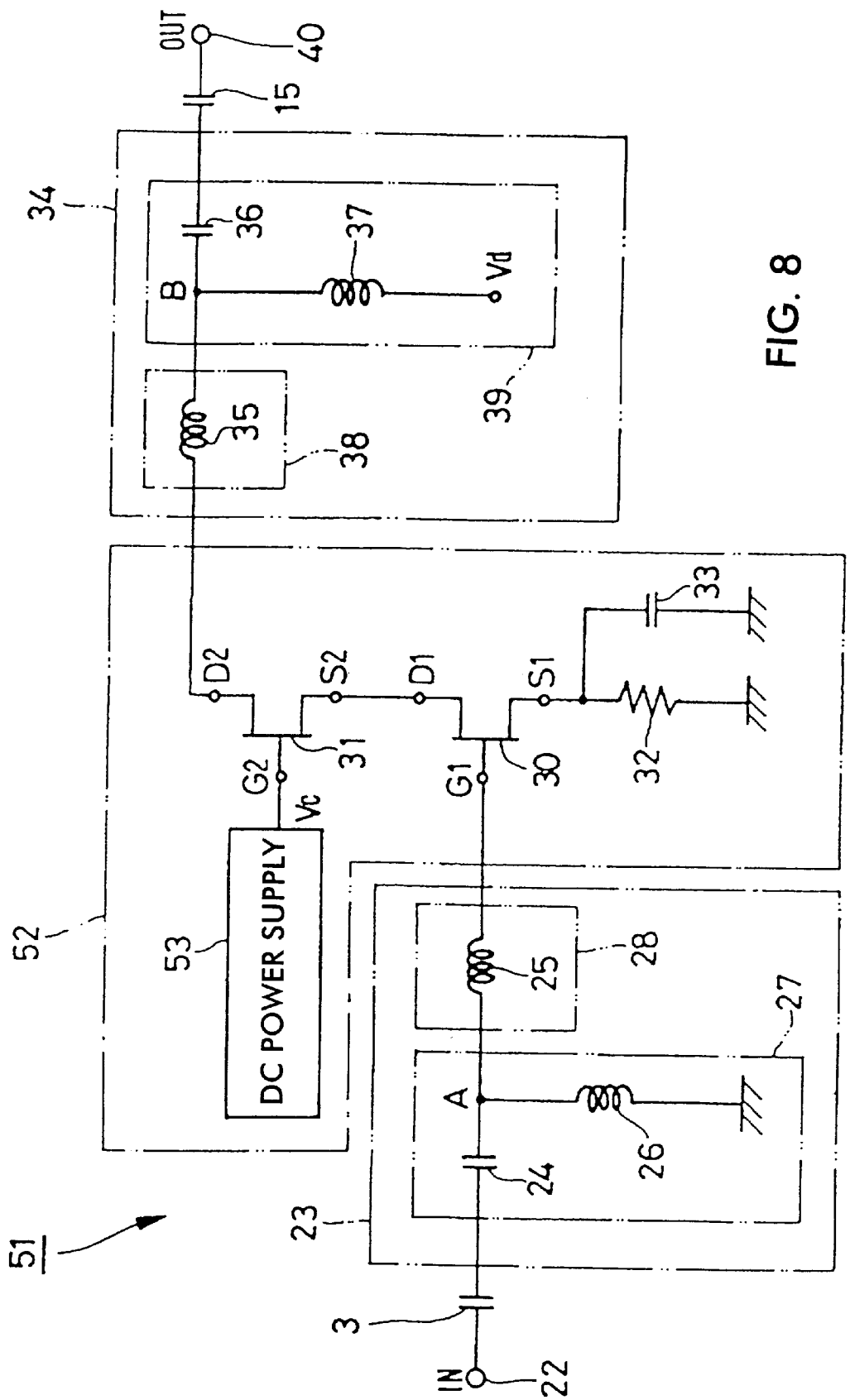
FIG. 8 is a circuit diagram of a high-frequency amplifier according to a second embodiment of the present invention.

In FIG. 5, a characteristic curve "a1" indicates the frequency characteristic of the noise factor of the high-frequency amplifier 21 according to the present embodiment, and in FIG. 6, a characteristic curve "b1" indicates the frequency characteristic of the gain. In FIG. 7, a characteristic curve "c1" indicates the input reflection characteristic, and a characteristic curve "d1" indicates the output reflection characteristic.

It is clearly shown in FIG. 5 to FIG. 7 that in the high frequency amplifier 21 of the present embodiment, the noise factor, the input reflection coefficient, and the output reflection coefficient are more reduced and the gain is more increased in a frequency band of 1.8 GHz to 2.0 GHz (center frequency 1.9 GHz) for a higher-band receiving signal, and a frequency band of 0.7 GHz to 1.0 GHz (center frequency 0.8 GHz) for a lower-band receiving signal, than in other frequency bands.

The noise factor, the input reflection coefficient, the output reflection coefficient, and the gain are mutually balanced and optimized for two high-frequency signals in different frequency bands. Therefore, two high-frequency signals in different frequency bands can be optimally amplified by one high-frequency amplifier 21.

Therefore, according to the present embodiment, a common portable telephone handling two communication radio waves in different frequency bands is not required to have two high-frequency amplifiers 21 corresponding to the frequency bands. In other words, a common portable telephone handling two communication radio waves in different frequency bands can be implemented just by providing one high-frequency amplifier 21 according to the present embodiment for the telephone. Size reduction, power saving, and cost reduction of the portable telephone can be achieved.

Second Embodiment

A high-frequency amplifier according to a second embodiment of the present invention will be described below by referring to FIG. 8 to FIG. 11. The present embodiment is characterized in that a voltage source is connected to the gate terminal of an output transistor serving as a part of an amplifying circuit and the voltage source changes a voltage applied to the gate terminal of the output transistor. In the present embodiment, the same numerals as those used in the first embodiment are assigned to the same constituents as those described in the first embodiment, and the descriptions thereof will be omitted.

In a high-frequency amplifier 51 according to the present embodiment, an amplifying circuit 52 is connected between an input matching circuit 23 and an output matching circuit 34. The amplifying circuit 52 includes an input transistor 30, an output transistor 31, a resistor 32, and a bypass capacitor 33 in the same way as for the amplifying circuit 29 according to the first embodiment. The amplifying circuit 52 according to the present embodiment is further provided with a DC power supply 53 serving as the voltage source.

The DC power supply 53 is connected to the gate terminal G2 of the output transistor 31 and applies a DC voltage Vc to the gate terminal G2 of the output transistor 31. The DC power supply 53 changes the voltage Vc applied to the gate terminal G2 of the output transistor 31 between when a higher-band receiving signal is amplified and when a lower-band receiving signal is amplified.

When the DC power supply 53 changes the voltage Vc applied to the gate terminal G2 of the output transistor 31, the impedance between the gate terminal G1 of the input transistor 30 and ground changes, and the impedance between the drain terminal D2 of the output transistor 31 and ground changes. Therefore, the noise factor, the input reflection coefficient, the output reflection coefficient, and the gain for a higher-band receiving signal and a lower-band receiving signal change.

With the use of this feature, when the amplifying circuit 52 amplifies a higher-band receiving signal, the DC power supply 53 applies a voltage Vc (for example, Vc=1.1 V) which balances the noise factor, the reflection coefficients, and the gain mutually and optimizes them for a higher-band receiving signal, to the gate terminal G2 of the output transistor 31. When a lower-band receiving signal is amplified, the DC power supply 53 applies a voltage Vc (for example, Vc=1.8 V) which balances the noise factor, the reflection coefficients, and the gain mutually and optimizes them for a lower-band receiving signal, to the gate terminal G2 of the output transistor 31. Therefore, input matching and output matching are successfully achieved for a higher-band receiving signal and a lower-band receiving signal.

The basic operations of the high-frequency amplifier 51 according to the present embodiment are the same as those of the high-frequency amplifier 21 according to the first embodiment. Now, an operation for changing a voltage in the power supply 53 will be described.

When a portable telephone is used an area where a communication radio wave in a frequency band of 1.8 GHz to 2.0 GHz is employed, a communication-radio-wave frequency-band changeover switch provided for the portable telephone is, for example, manually or automatically switched. Interlocked with this switch, a voltage Vc output from the DC power supply 53 is set, for example, to 1.1 V. Under this condition, when the portable telephone receives a communication radio wave in a frequency band of 1.8 GHz to 2.0 GHz and the communication radio wave is input to the high-frequency amplifier 51 as a higher-band receiving signal, the input matching circuit 23, the amplifying circuit 52, and the output matching circuit 34 in the high-frequency amplifier 51 achieve matching for this higher-band receiving signal such that the noise factor, the reflection coefficients, and the gain become optimum, and the signal is highly efficiently amplified.

When the portable telephone is used in an area where a communication radio wave in a frequency band of 0.7 GHz to 1.0 GHz is employed, the communication-radio-wave frequency-band changeover switch provided for the portable telephone is manually or automatically switched. Interlocked with this switch, a voltage Vc output from the DC power supply 53 is set, for example, to 1.8 V. Under this condition, when the portable telephone receives a communication radio wave in a frequency band of 0.7 GHz to 1.0 GHz and the communication radio wave is input to the high-frequency amplifier 51 as a lower-band receiving signal, the input matching circuit 23, the amplifying circuit 52, and the output matching circuit 34 in the high-frequency amplifier 51 achieve matching for this lower-band receiving signal such that the noise factor, the reflection coefficients, and the gain become optimum, and the signal is highly efficiently amplified.

According to this embodiment, since the DC power supply 53 changes a voltage Vc applied to the gate terminal G2 of the output transistor 31 between when a higher-band receiving signal is amplified and when a lower-band receiving signal is amplified, input matching and output matching are successfully achieved for a higher-band receiving signal and a lower-band receiving signal.

Figure 9:
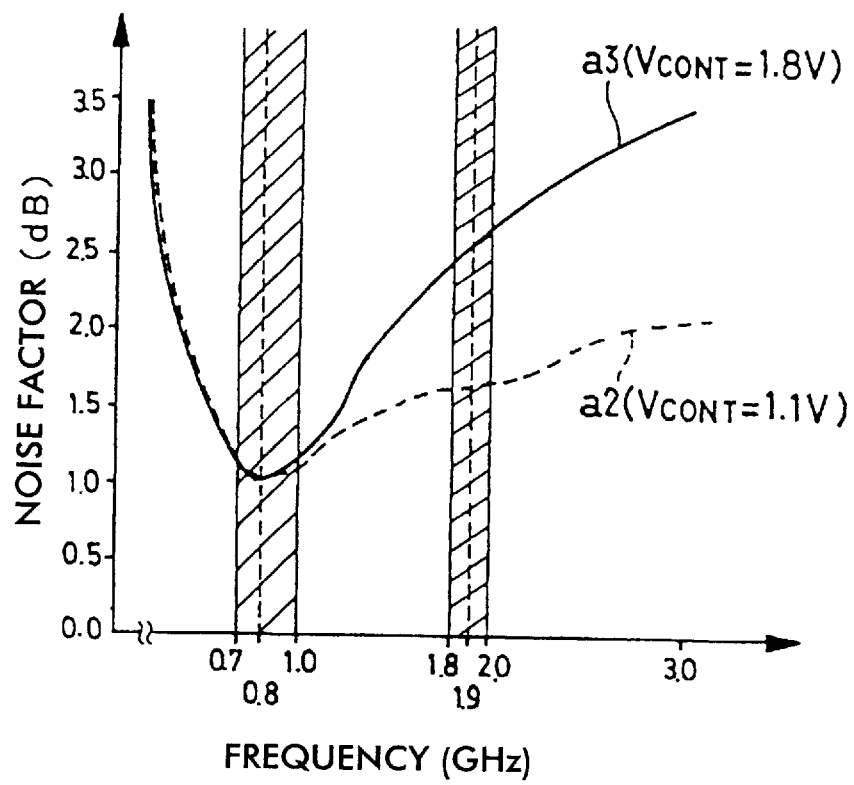
FIG. 9 is a characteristic-curve chart showing the frequency characteristic of the noise factor of the high-frequency amplifier.

In FIG. 9, a characteristic curve "a2" indicates the frequency characteristic of the noise factor of the high-frequency amplifier 51 obtained when the DC power supply 53 outputs an applied voltage Vc of 1.1 V, and a characteristic curve "a3" indicates the frequency characteristic of the noise factor of the high-frequency amplifier 51 obtained when the DC power supply 53 outputs an applied voltage Vc of 1.8 V. It is clearly understood from the figure that the noise factor is reduced at 1.9 GHz (center frequency of a higher-band receiving signal) when the DC power supply 53 changes the voltage Vc from 1.8 V to 1.1 V.

Figure 10:
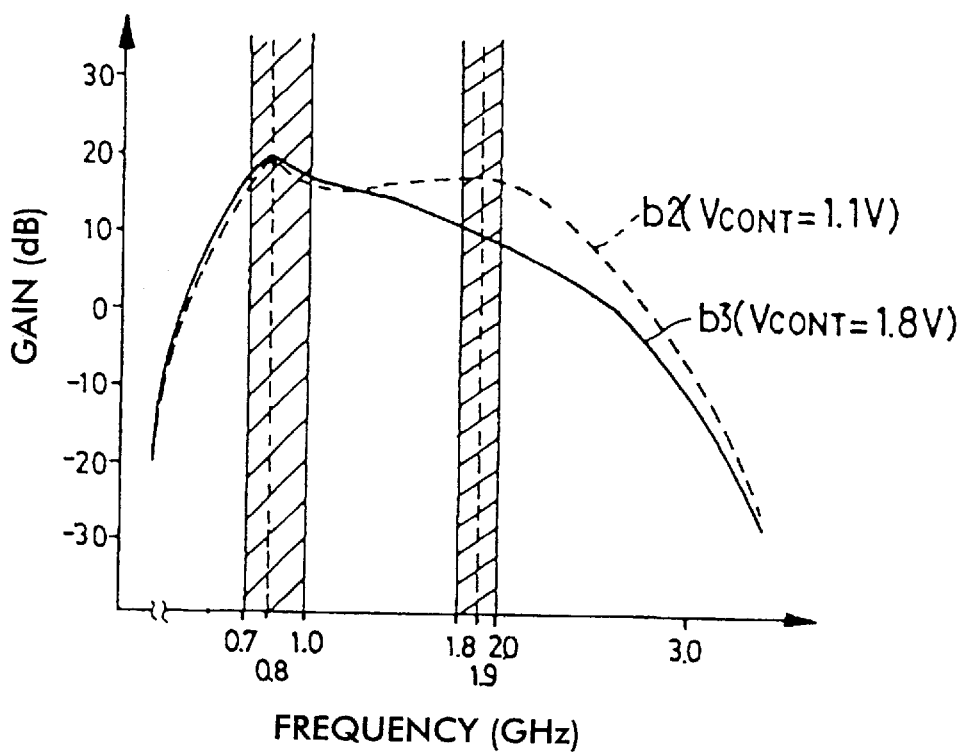
FIG. 10 is a characteristic-curve chart showing the frequency characteristic of the gain of the high-frequency amplifier.

In FIG. 10, a characteristic curve "b2" indicates the frequency characteristic of the gain of the high-frequency amplifier 51 obtained when the DC power supply 53 outputs an applied voltage Vc of 1.1 V, and a characteristic curve "b3" indicates the frequency characteristic of the gain of the high-frequency amplifier 51 obtained when the DC power supply 53 outputs an applied voltage Vc of 1.8 V. It is clearly understood from the figure that the gain is increased at 1.9 GHz when the DC power supply 53 changes the voltage Vc from 1.8 V to 1.1 V.

Figure 11:
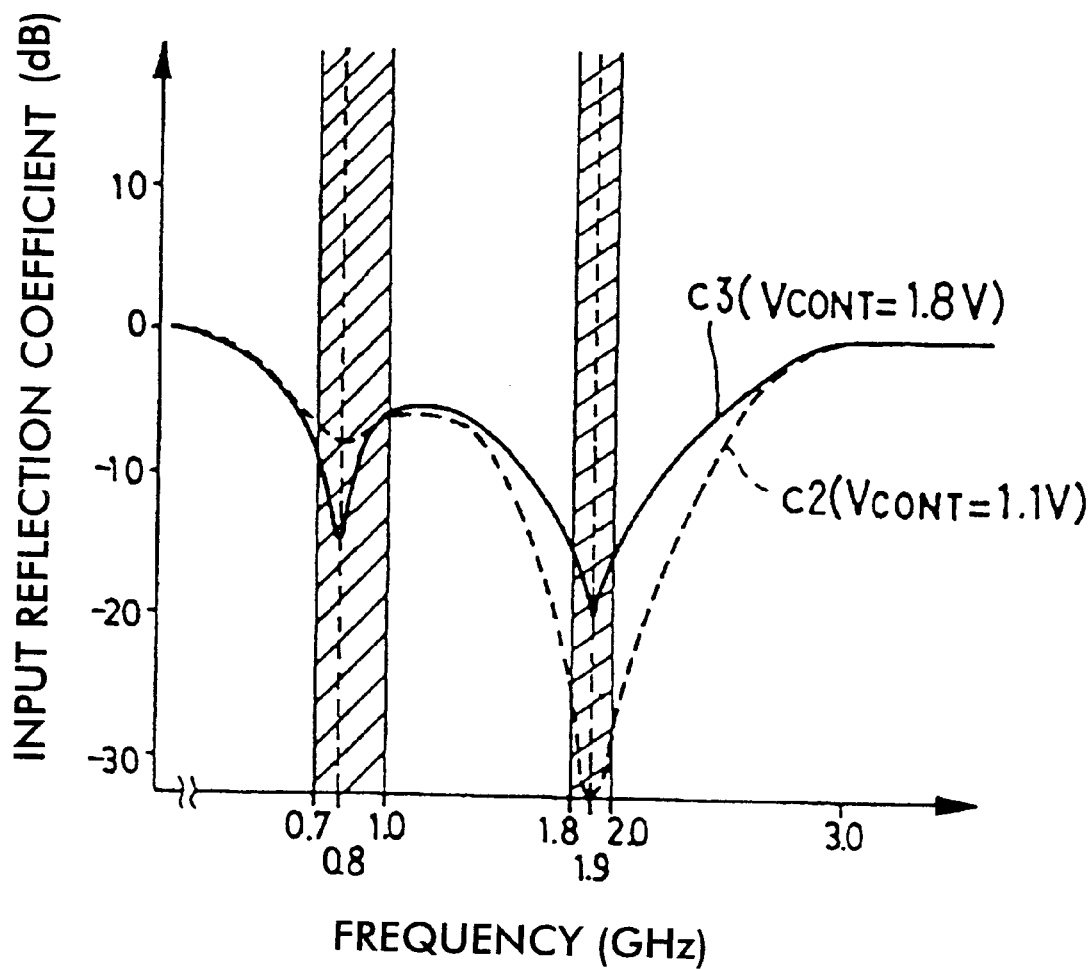
FIG. 11 is a characteristic-curve chart showing the frequency characteristic of the input reflection coefficient of the high-frequency amplifier.
Figure 12:
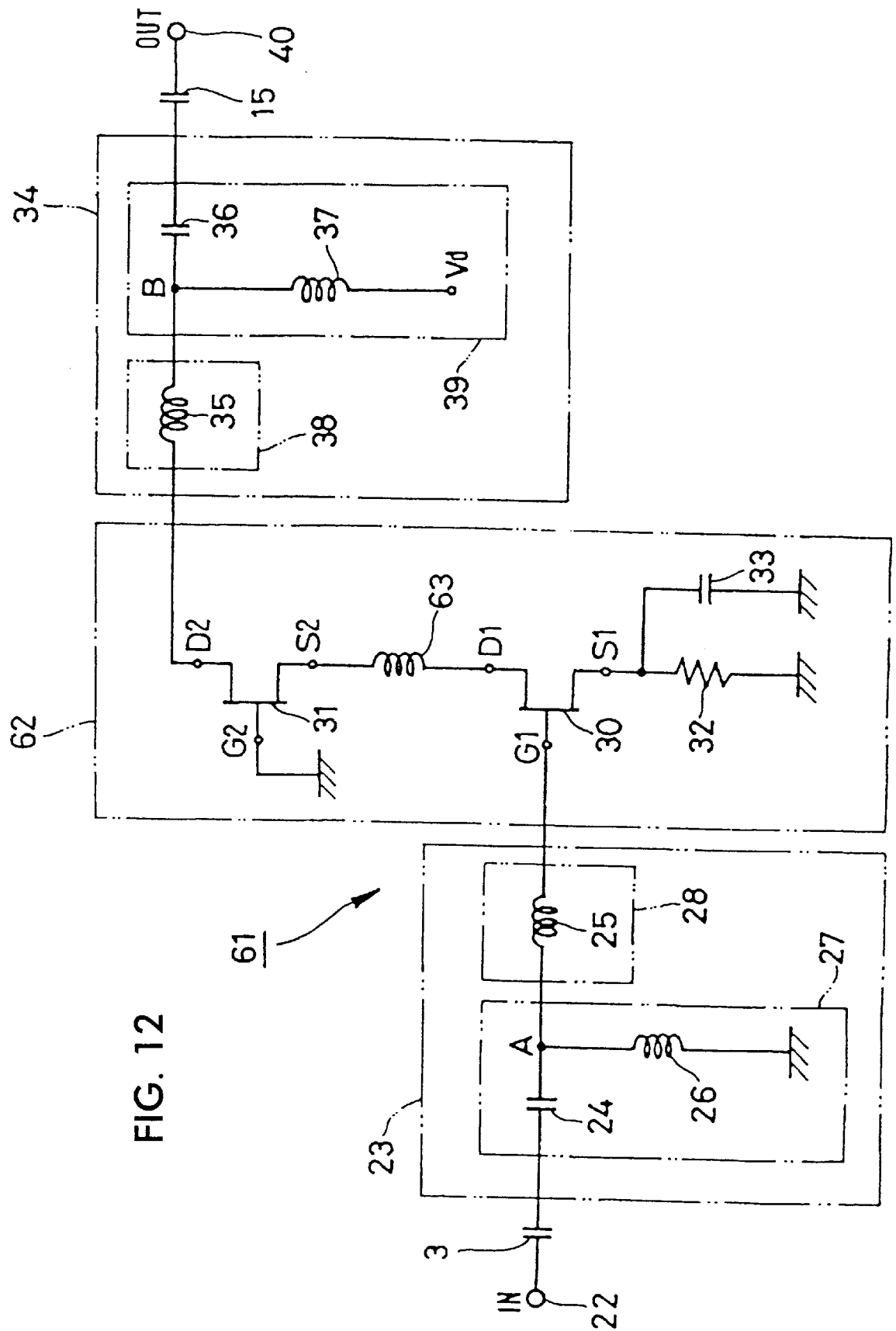
FIG. 12 is a circuit diagram of a high-frequency amplifier according to a third embodiment of the present invention.

In FIG. 11, a characteristic curve "c2" indicates the frequency characteristic of the input reflection coefficient of the high-frequency amplifier 51 obtained when the DC power supply 53 outputs an applied voltage Vc of 1.1 V, and a characteristic curve "c3" indicates the frequency characteristic of the input reflection coefficient of the high-frequency amplifier 51 obtained when the DC power supply 53 outputs an applied voltage Vc of 1.8 V. It is clearly understood from the figure that the input reflection coefficient is greatly reduced at 1.9 GHz when the DC power supply 53 changes the voltage Vc from 1.8 V to 1.1 V. The frequency characteristic of the output reflection coefficient has nearly the same characteristic as that of the input reflection coefficient.

As described above, when the DC power supply outputs an applied voltage Vc of 1.8 V, the noise factor, the input reflection coefficient, and the output reflection coefficient are reduced and the gain is increased in a frequency band of 0.7 GHz to 1.0 GHz, and the noise factor, the input reflection coefficient, the output reflection coefficient, and the gain are mutually balanced and optimized for a lower-band receiving signal. When the DC power supply outputs an applied voltage Vc of 1.1 V, the noise factor, the input reflection coefficient, and the output reflection coefficient are reduced and the gain is increased in a frequency band of 1.8 GHz to 2.0 GHz, and the noise factor, the input reflection coefficient, the output reflection coefficient, and the gain are mutually balanced and optimized for a higher-band receiving signal.

According to the present embodiment, when the DC power supply 53 changes an applied voltage Vc in response to switching between receiving a lower-band receiving signal and receiving a higher-band receiving signal, the frequency characteristics of the noise factor, the input reflection coefficient, the output reflection coefficient, and the gain are changed. Therefore, the noise factor, the input reflection coefficient, the output reflection coefficient, and the gain are optimized separately for a lower-band frequency signal and a higher-band frequency signal, and input matching and output matching are more successfully achieved for two high-frequency signals in different frequency bands.

Third Embodiment

A high-frequency amplifier according to a third embodiment of the present invention will be described below by referring to FIG. 12 to FIG. 15. The present embodiment is characterized in that an impedance circuit is connected between an input transistor and an output transistor in an amplifying circuit. In the present embodiment, the same numerals as those used in the first embodiment are assigned to the same constituents as those described in the first embodiment, and the descriptions thereof will be omitted.

A high-frequency amplifier 61 according to the present embodiment includes an input matching circuit 23 connected to an input terminal 22 through a capacitor 3, an amplifying circuit 62 described later and connected subsequently to the input matching circuit 23, and an output matching circuit 34 disposed subsequently to the amplifying circuit 62 and connected between the amplifying circuit 62 and an output terminal 40.

The amplifying circuit 62 includes an input transistor 30, an output transistor 31 connected in cascade to the input transistor 30, a resistor 32 connected between the source terminal S1 of the input transistor 30 and ground, a bypass capacitor 33 connected in parallel to the resistor 32, and a coil 63 connected between the drain terminal D1 of the input transistor 30 and the source terminal S2 of the output transistor 31, serving as an impedance circuit.

The input transistor 30 and the output transistor 31 are formed of field effect transistors (FETs). The gate terminal G1 of the input transistor 30 is connected to a coil 25 of the input matching circuit 23, the gate terminal G2 of the output transistor 31 is connected to ground, and the drain terminal D2 is connected to a coil 35 of an output matching circuit 34.

The resistor 32 and the bypass capacitor 33 form a self-bias circuit for applying a DC bias to a high-frequency signal input to the amplifying circuit 62. The resistance of the resistor 32 is set, for example, to 80 Ω and the capacitance of the bypass capacitor 33 is, for example, set to 100 pF.

A solenoid coil, for example, is used for the coil 63. The inductance of the coil 63 is set by a method described later such that a large intercept point P is obtained. In the present embodiment, it is set, for example, to 3 nH.

The inventor actively performed experiments and research in order to improve an intercept point P. As a result, as shown in FIG. 13, the inventor derived a characteristic curve "g" drawn by a solid line indicating the relationship between the inductance of the coil 63 and the output intercept point P, and a characteristic curve "h" drawn by a two-dot chain line indicating the relationship between the inductance of the coil 63 and the input intercept point P.

Figure 13:
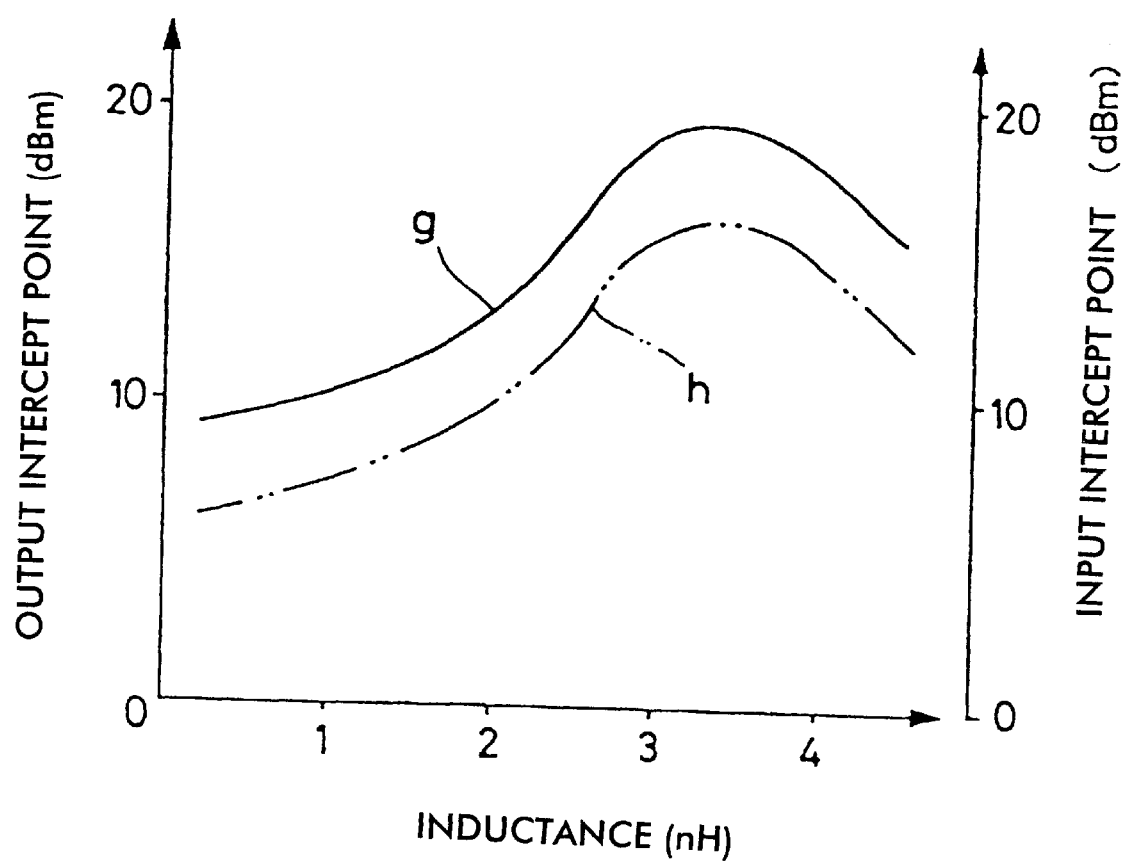
FIG. 13 is a characteristic-curve chart indicating the level of the intercept point corresponding to an inductance.

It is clearly understood from FIG. 13 that a large input intercept point P and a large output intercept point P can be obtained when the inductance of the coil 63 is set, for example, to about 3 nH. Therefore, the characteristic curve of the fundamental-wave output signal and that of the third intermodulation waveform-distorted wave output signal in the amplifying circuit 62 have good linearity.

Figure 14:
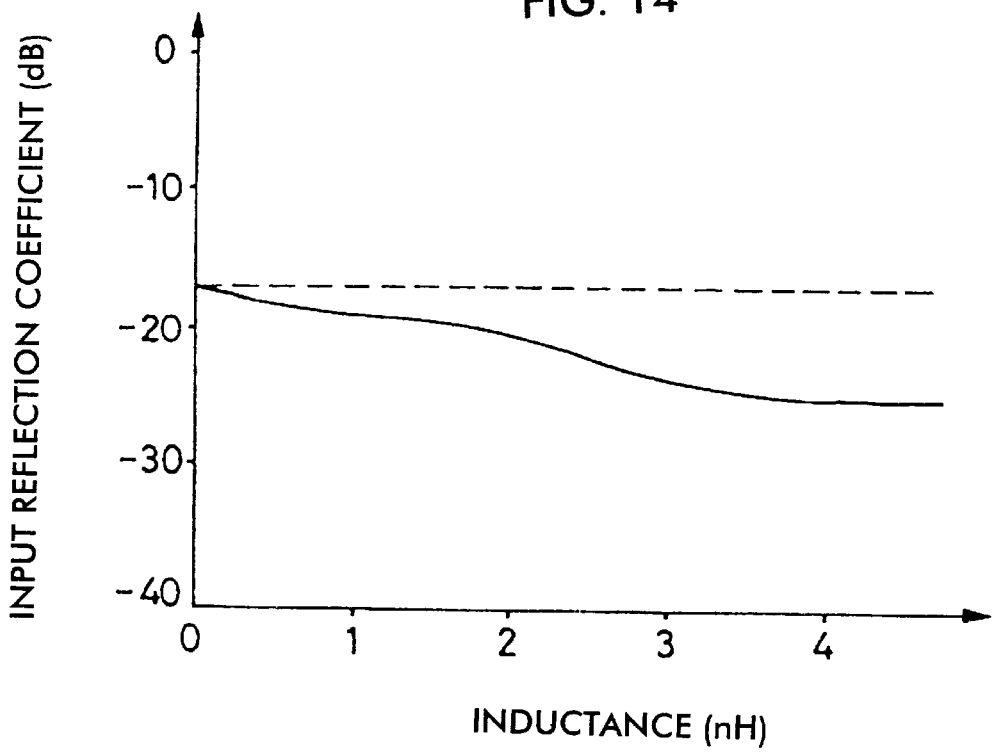
FIG. 14 is a characteristic-curve chart showing the relationship between an inductance and an input reflection coefficient in the high-frequency amplifier.

The relationship between the inductance of the coil 63 and the input reflection coefficient will be described below by referring to FIG. 14. A dotted line in FIG. 14 shows the input reflection coefficient in a case when the coil 63 is not provided. It is clearly understood from a characteristic curve drawn by a solid line in FIG. 14 that the input reflection coefficient becomes smaller than in a case in which the coil 63 is not provided, that is, in which the inductance is zero. Therefore, even when the coil 63 is connected between the input transistor 30 and the output transistor 31, the input reflection coefficient does not deteriorate and the intercept point P is successfully maintained.

Figure 15:
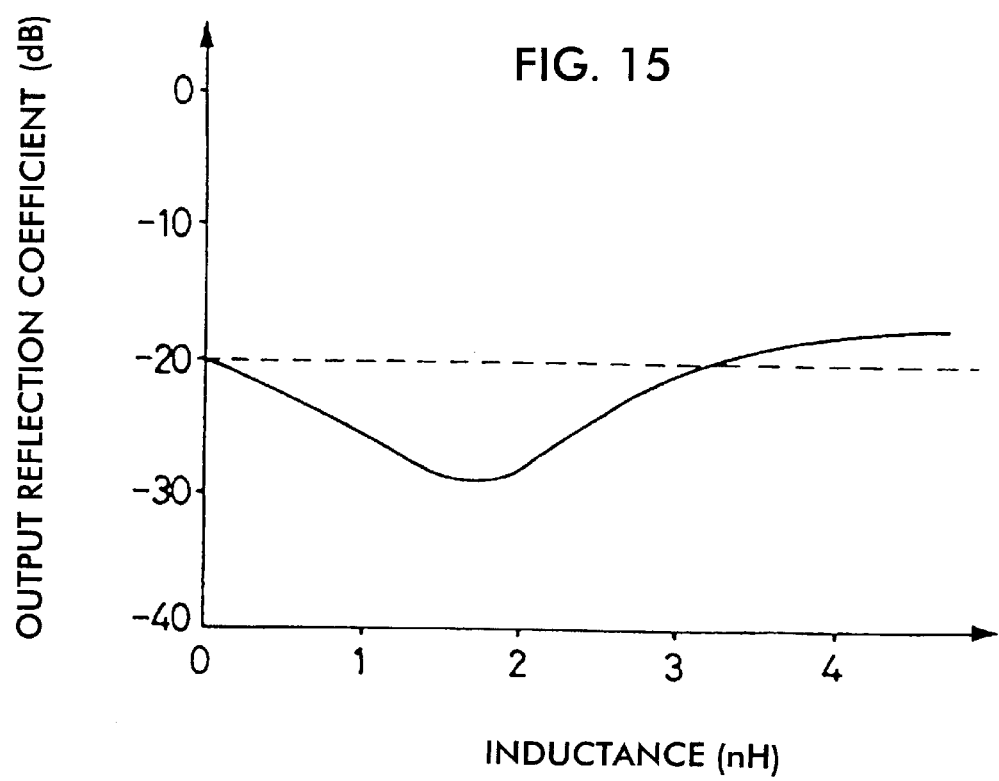
FIG. 15 is a characteristic-curve chart showing the relationship between an inductance and an output reflection coefficient in the high-frequency amplifier.

The relationship between the inductance of the coil 63 and the output reflection coefficient will be described below by referring to FIG. 15. A dotted line in FIG. 15 shows the output reflection coefficient in a case when the coil 63 is not provided. It is clearly understood from a characteristic curve drawn by a solid line in FIG. 15 that the output reflection coefficient is smaller in an inductance range of 0 to 3 nH than in a case in which the coil 63 is not provided, that is, in which the inductance is zero, and the output reflection coefficient is slightly larger in an inductance range of 3 nH or more. However, since the output reflection characteristic of a high-frequency low-noise amplifier used in a mobile communication unit is usually designed to be −10 dB or less, no problem is caused even when a coil 63 having an inductance of 3 nH or more is connected. Therefore, even when the coil 63 is connected between the input transistor 30 and the output transistor 31, the output reflection coefficient does not deteriorate and the intercept point P is successfully maintained.

In the present embodiment, since the coil 63 is connected between the drain terminal D1 of the input transistor 30 and the source terminal S2 of the output transistor 31, and the inductance of the coil 63 is set to the optimal value, a satisfactory intercept point P is obtained.

As a result, since a satisfactory intercept point P is obtained in the high-frequency amplifier 61 without causing input and output matching conditions for a high-frequency signal to deteriorate, the characteristic curve of the fundamental-wave output signal and that of the third intermodulation waveform-distorted wave output signal have good linearity.

Fourth Embodiment

Figure 16:
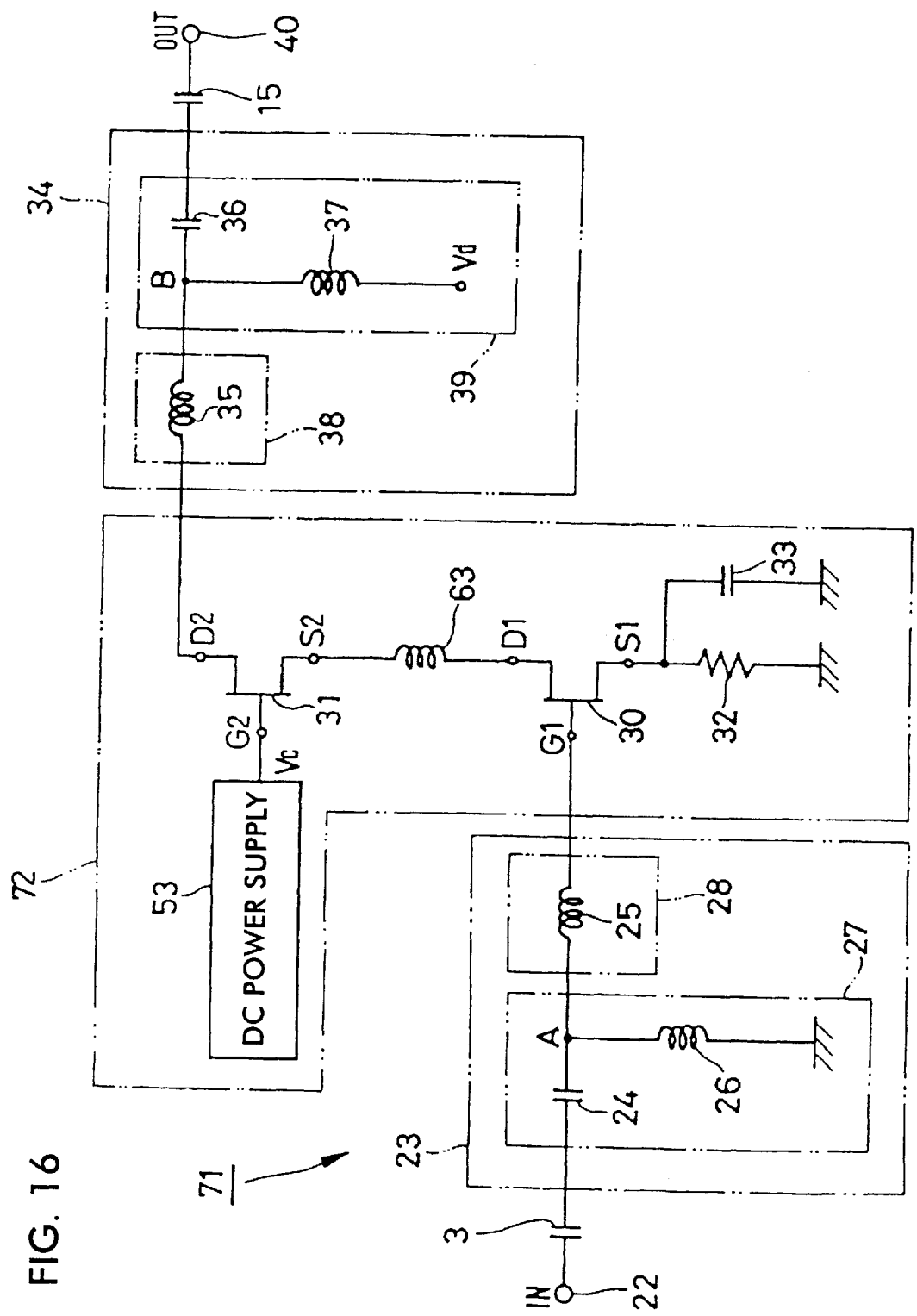
FIG. 16 is a circuit diagram of a high-frequency amplifier according to a fourth embodiment of the present invention.

A high-frequency amplifier according to a fourth embodiment of the present invention will be described below by referring to FIG. 16. The present embodiment is characterized in that an impedance circuit is connected between an input transistor and an output transistor in an amplifying circuit, a voltage source is connected to the gate terminal of the output transistor serving as a part of the amplifying circuit, and the voltage source changes a voltage applied to the gate terminal of the output transistor. In the present embodiment, the same numerals as those used in the first to third embodiments are assigned to the same constituents as those described in the first to third embodiments, and the descriptions thereof will be omitted.

In a high-frequency amplifier 71 according to the present embodiment, an amplifying circuit 72 is connected between an input matching circuit 23 and an output matching circuit 34. The amplifying circuit 72 includes an input transistor 30, an output transistor 31, a resistor 32, a bypass capacitor 33, and a coil 63 in the same way as in the amplifying circuit 62 according to the third embodiment. The amplifying circuit 72 of the present embodiment is further provided with a DC power supply 53 serving as the voltage source.

The DC power supply 53 is connected to the gate terminal G2 of the output transistor 31 in the same way as in the second embodiment. The DC power supply 53 switches the voltage Vc applied to the gate terminal G2 of the output transistor 31 between when a higher-band receiving signal in a frequency band of 1.8 GHz to 2.0 GHz is amplified and when a lower-band receiving signal in a frequency band of 0.7 GHz to 1.0 GHz is amplified. With this voltage Vc being switched, the amplifying circuit 72 can be used both for receiving a higher-band receiving signal and for receiving a lower-band receiving signal. As a result, satisfactory electrical characteristics for a higher-band receiving signal and a lower-band receiving signal, such as the gain, the noise factor, and the input and output reflection losses, are obtained.

The coil 63 is connected between the drain terminal D1 of the input transistor 30 and the source terminal S2 of the output transistor 31 in the same way as in the third embodiment. The inductance of the coil 63 is set to the best value so as to increase the intercept point by reducing the input reflection loss and the output reflection loss.

In the high-frequency amplifier 71 configured as described above according to the present embodiment, the coil 63 increases the intercept point, and the linearity of the high-frequency amplifier 71 is improved. By the use of the DC power supply 53 as in the first embodiment, the high-frequency amplifier 71 balances the noise factor, the input reflection coefficient, the output reflection coefficient, and the gain mutually and optimizes them in two frequency bands, a frequency band of 0.7 GHz to 1.0 GHz and that of 1.8 GHz to 2.0 GHz.

Modified Embodiments

In the above embodiments, the amplifying circuits 29, 52, 62, and 72 in the high-frequency amplifier circuits 21, 51, 61, and 71 are provided with the self-bias circuit formed of the resistor 32 and the bypass capacitor 33, and one end of the coil 26 of the input matching circuit 23 is grounded. However, the present invention is not limited to this configuration.

Figure 17:
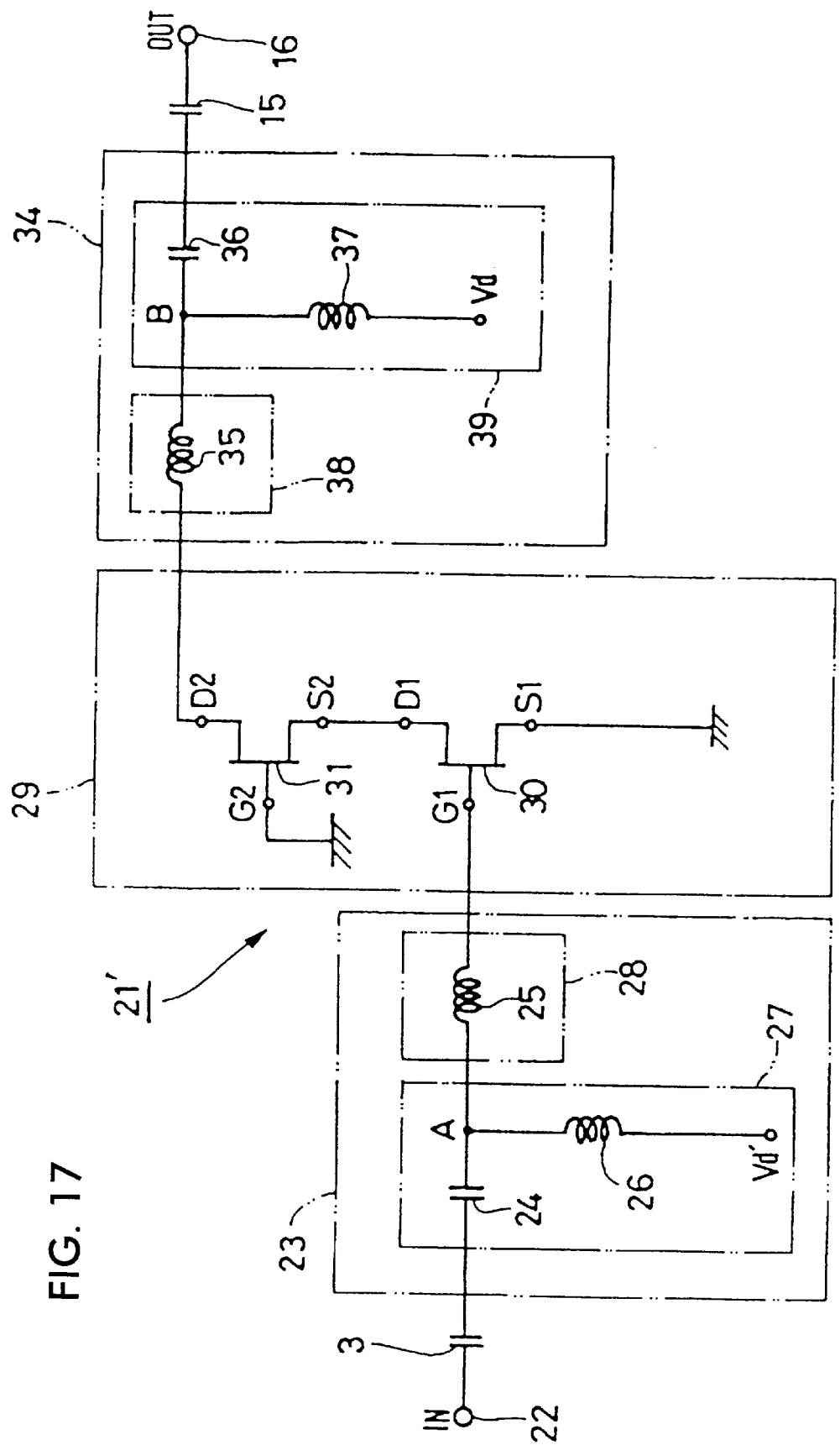
FIG. 17 is a circuit diagram of a modification of the high-frequency amplifier according to the first embodiment of the present invention.
Figure 18:
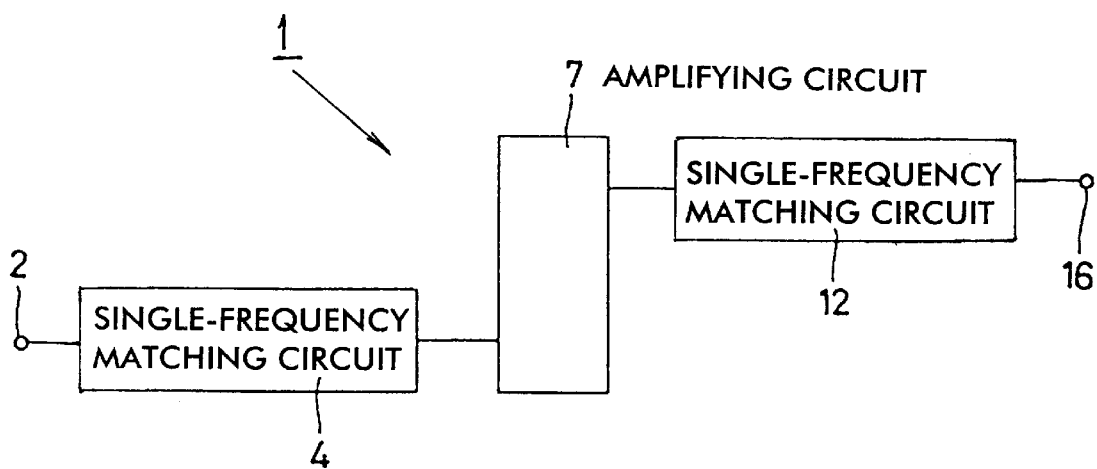
FIG. 18 is a block diagram showing a configuration of a high-frequency amplifier using a conventional technology.
Figure 19:
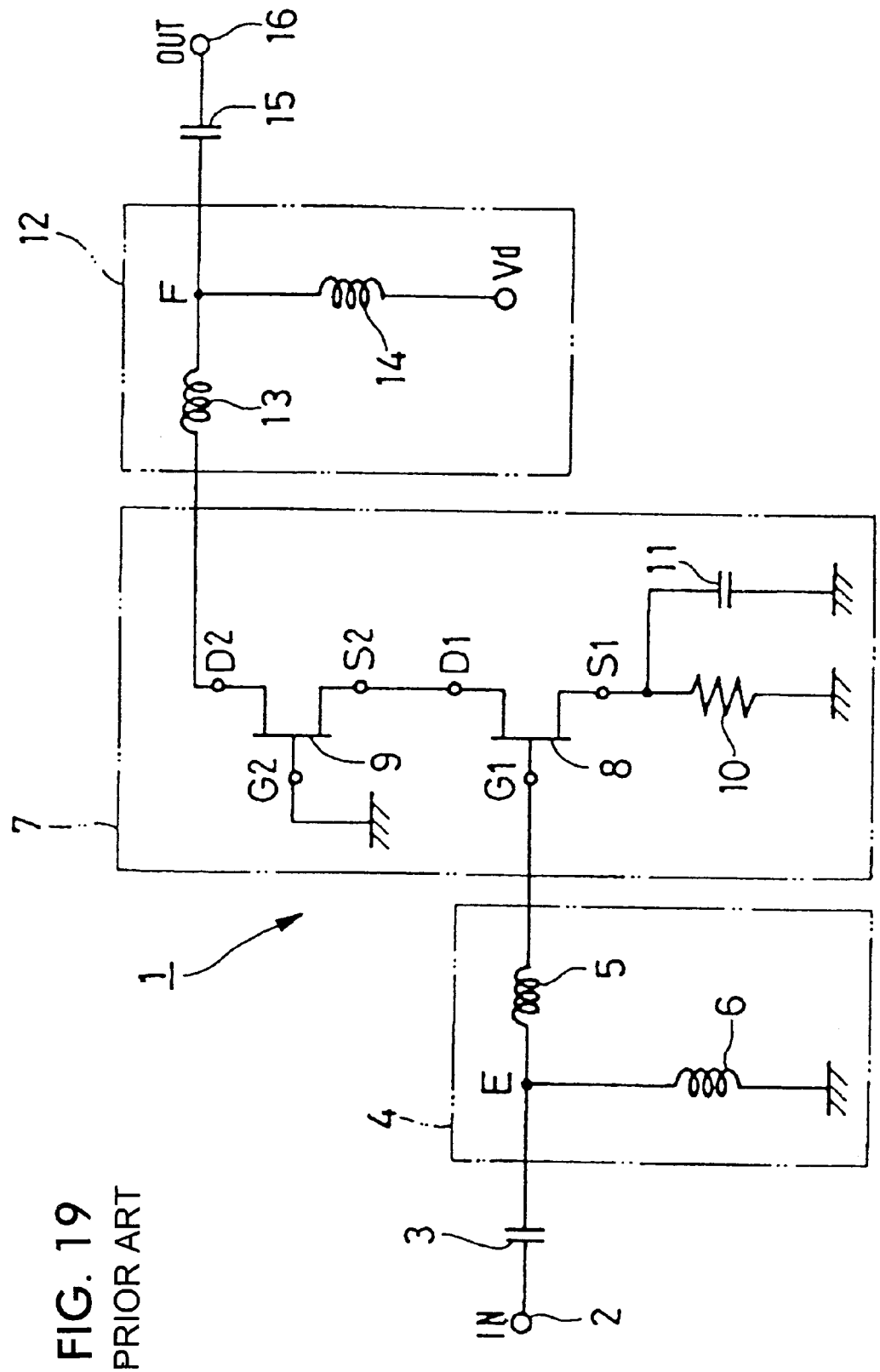
FIG. 19 is a circuit diagram showing a basic configuration of the high-frequency amplifier using the conventional technology.
Figure 20:
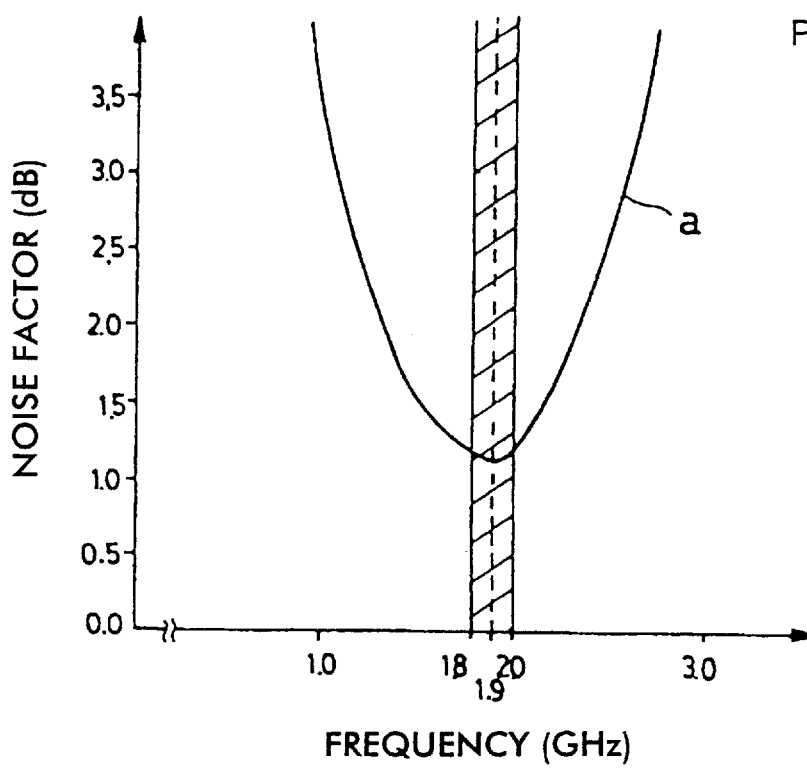
FIG. 20 is a characteristic-curve chart showing the frequency characteristic of the noise factor of the high-frequency amplifier.
Figure 21:
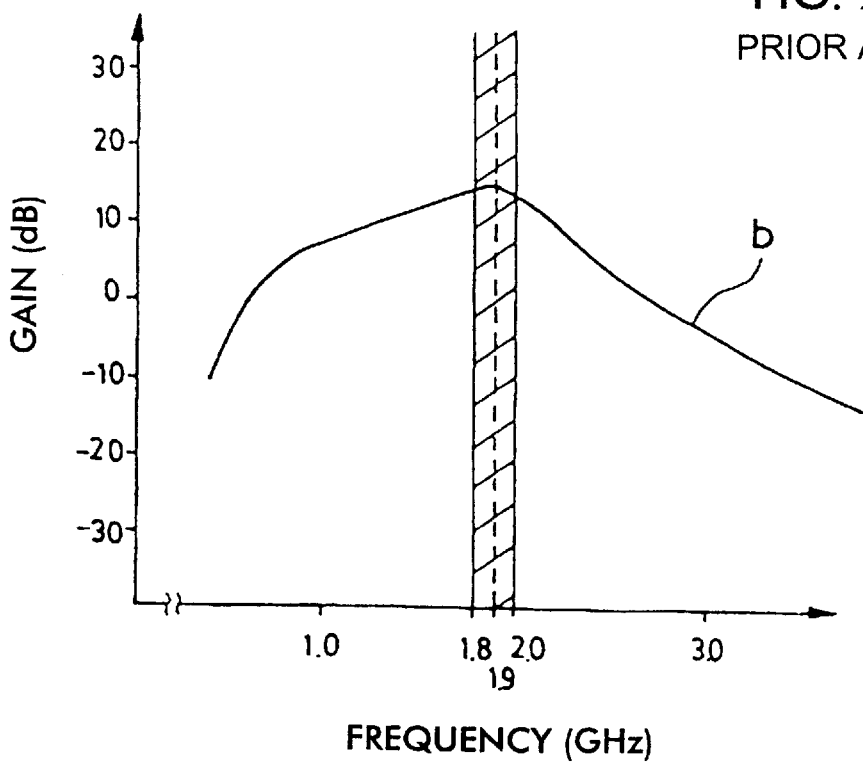
FIG. 21 is a characteristic-curve chart showing the frequency characteristic of the gain of the high-frequency amplifier.
Figure 22:
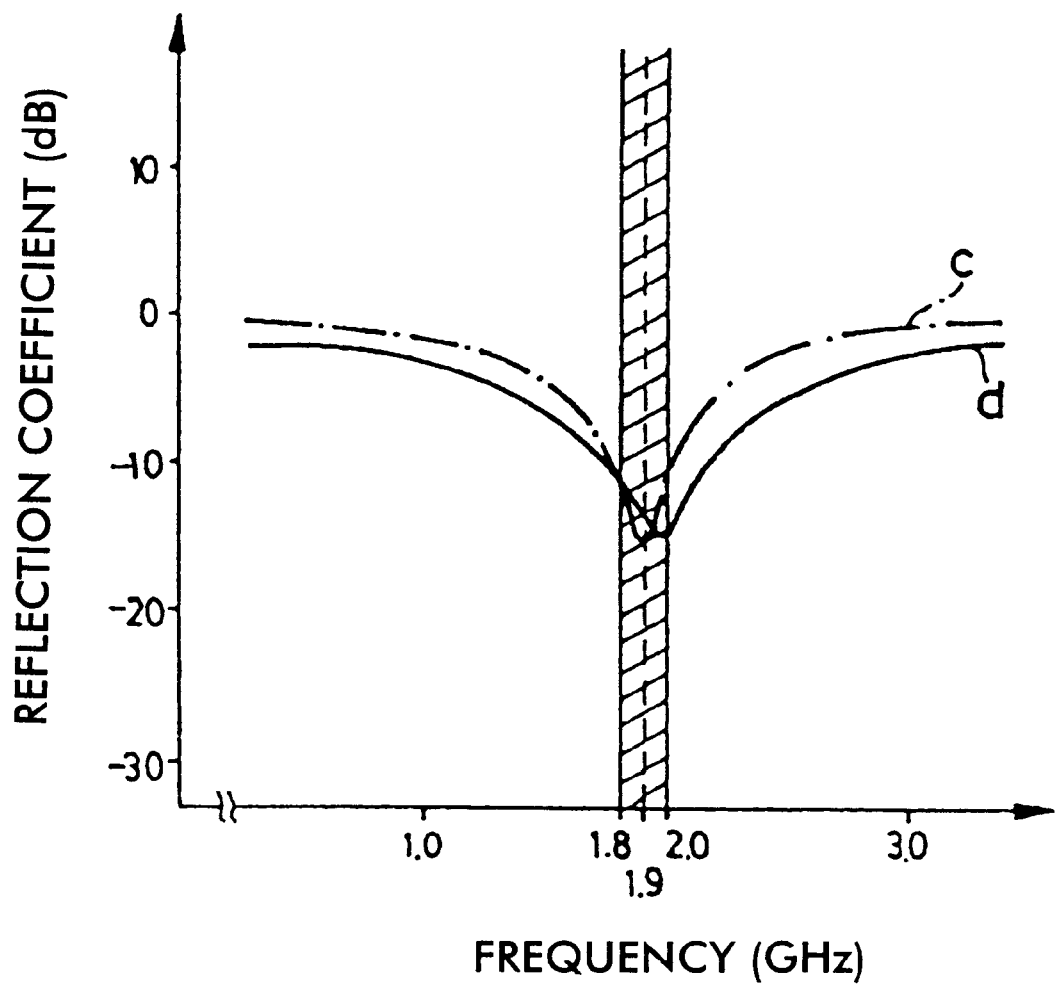
FIG. 22 is a characteristic-curve chart showing the frequency characteristics of the input reflection coefficient and the output reflection coefficient of the high-frequency amplifier.
Figure 23:
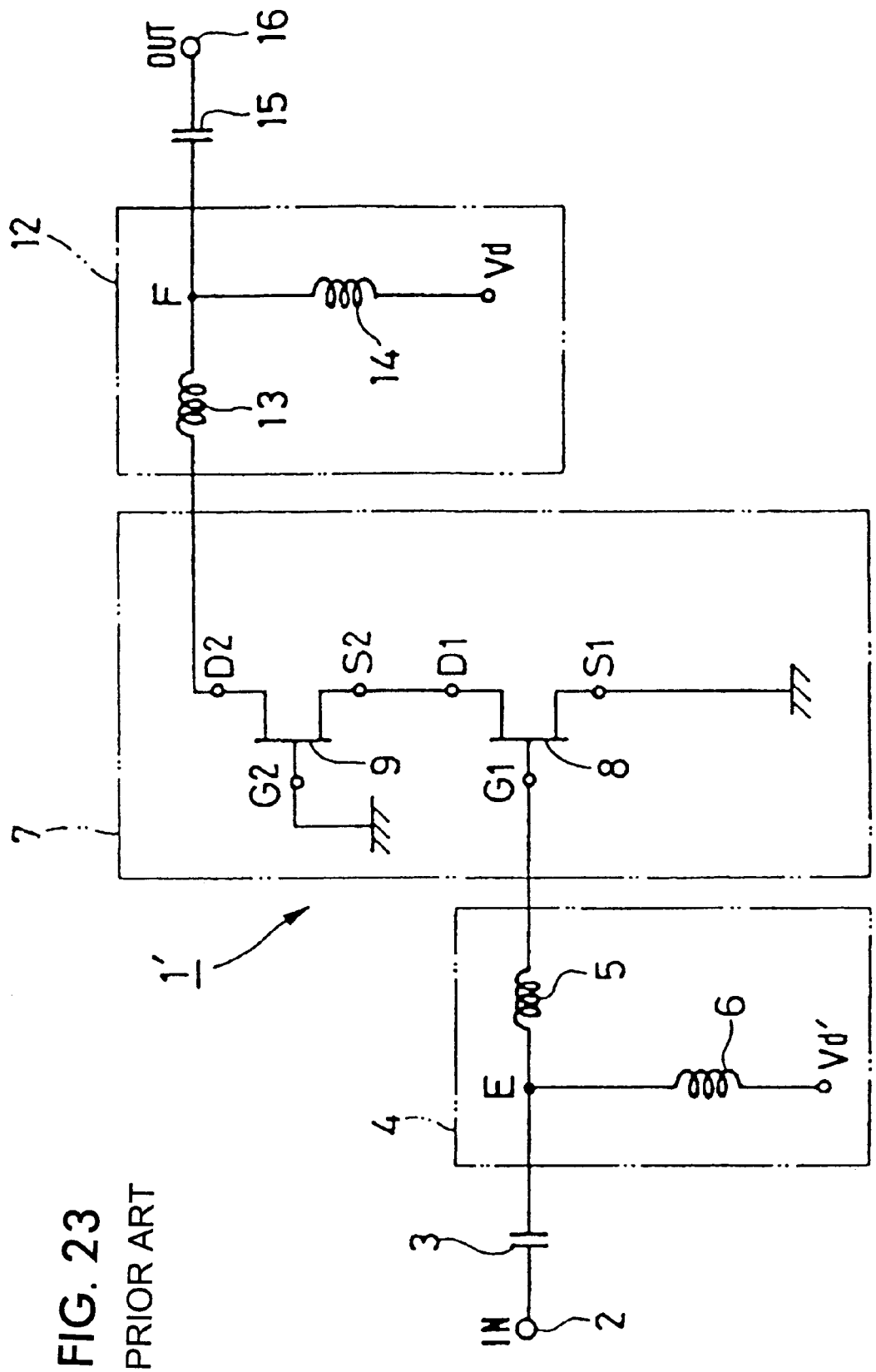
FIG. 23 is a circuit diagram showing a high-frequency amplifier according to another conventional technology.
Figure 24:
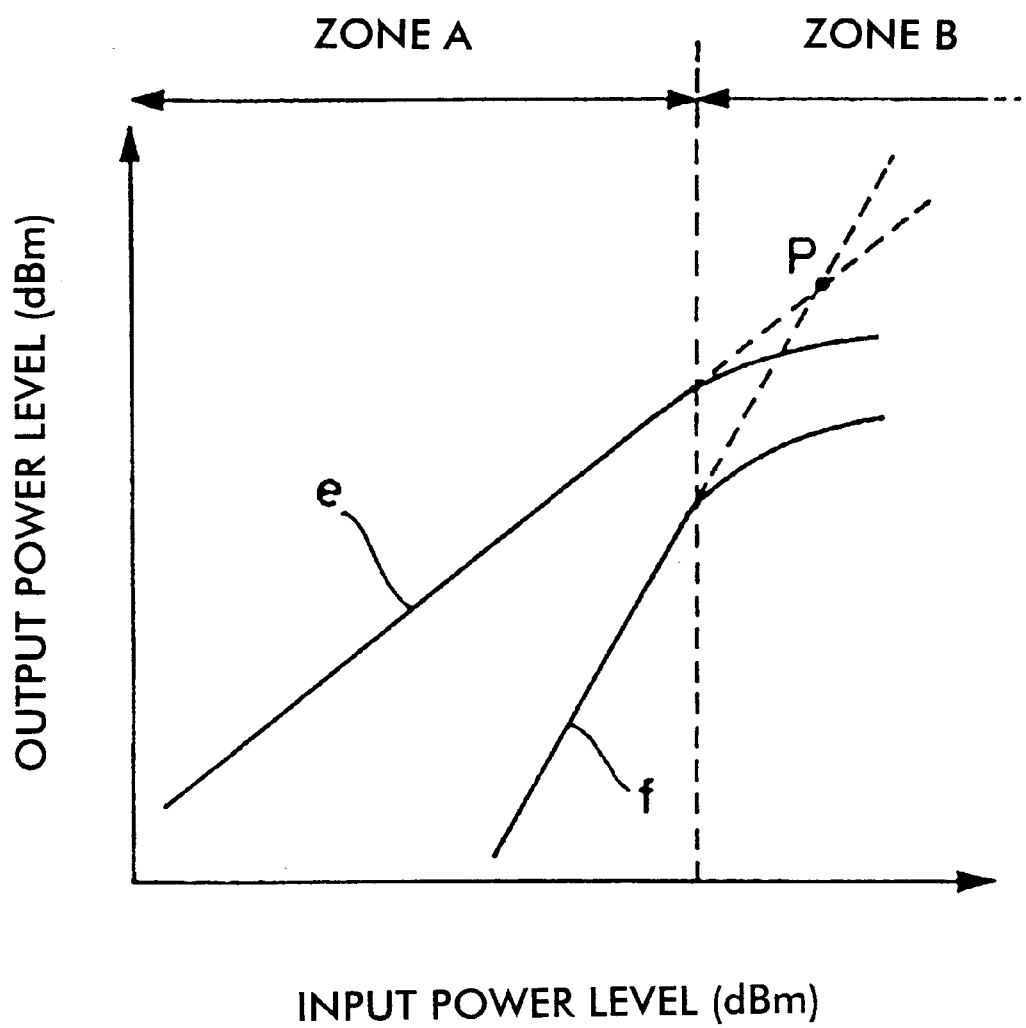
FIG. 24 is a characteristic-curve chart showing the input and output characteristics of the high-frequency amplifier using the conventional technology.

For example, in a high-frequency amplifier 21' shown in FIG. 17, a high-frequency amplifier according to the present invention may be configured without the resistor 32 and the bypass capacitor 33 in the amplifying circuit 29, and a fixed voltage Vd' of, for example, −0.7 V may be applied to one end of the coil 26, instead of grounding one end of the coil 26 in the input matching circuit 23.

In the above embodiments, field effect transistors are used for the input transistor 30 and the output transistor 31. However, bipolar transistors or high electron mobility transistors (HEMTs) may be used for the input transistor 30 and the output transistor 31.

In the above embodiments, the values described for the capacitances of the capacitors 24 and 36, the inductances of the coils 25, 26, 35, and 37, the value of the coil 63 in the high-frequency amplifiers are only examples. They are not limited to these values.

In the above embodiments, matching is achieved for a higher-band receiving signal in a frequency band of 1.8 GHz to 2.0 GHz and for a lower-band receiving signal in a frequency band of 0.7 GHz to 1.0 GHz. The frequency bands of high-frequency signals are not limited to these bands. Matching can be achieved for two high-frequency signals in other frequency bands and highly efficient amplification thereof can be implemented by adjusting appropriately the capacitance of the capacitor 24, the inductances of the coils 25 and 26 in the input matching circuit, the capacitance of the capacitor 36, and the inductances of the coils 35 and 37 in the output matching circuit 34 to adjust the frequency characteristics of the noise factor, the gain, the input reflection coefficient, and the output reflection coefficient.

In the first embodiment, the amplifying circuit 29 is formed of the input transistor 30 and the output transistor 31 connected in cascade. However, the amplifying circuit 29 may be configured with a single transistor. An amplifying circuit having another configuration can also be used.

In the second embodiment, matching is achieved for two high-frequency signals, a higher-band receiving signal and a lower-band receiving signal, by changing the voltage Vc applied by the DC power supply 53. The present invention is not limited to this condition. Matching can be achieved for three high-frequency signals or more in different frequency bands by changing the voltage Vc applied by the DC power supply 53.

In the third and fourth embodiments, the coil 63 is formed of a solenoid coil. However, it may be configured as an inductance device formed of a transmission line, for example, having the same inductance as the coil 63 by adjusting the length of the transmission line and the impedance.

In the above embodiments, the high-frequency amplifier according to the present invention is mounted in the receiver of a portable telephone. The present invention is not limited to this use. It can also be applied to the transmitter of a portable telephone, other mobile communication units, and satellite communication units, for example.

Further, the invention is not limited to the apparatus described herein, but relates as well to the methods carried out by such apparatus.

Although embodiments of the invention have been described above, the invention is not limited to those embodiments, but should be considered to include all modifications, variations and equivalents that may occur to those having the ordinary level of skill in the pertinent art.

What is claimed is:

1. A high-frequency amplifier for matching both a lower-band high-frequency signal and a higher-band high-frequency signal, comprising:

an amplifying circuit having an input and an output;

an input circuit and an output circuit;

an input matching circuit connected between the input of said amplifying circuit and the input circuit; and an output matching circuit connected between the output of said amplifying circuit and the output circuit, wherein said input circuit includes an input terminal, an input coupling capacitor connected in series between said input terminal and said input matching circuit, wherein said input matching circuit includes an input matching capacitor connected to said input circuit, said input matching capacitor being separate from said input coupling capacitor, a first inductor connected between said input matching capacitor and said amplifying circuit, and a second inductor connected to the connection point of said capacitor and said first inductor, wherein said input matching capacitor and said second inductor form a lower-band frequency matching circuit for achieving matching for a lower-band high-frequency signal, and said first inductor forms a higher-band frequency matching circuit for achieving matching for a higher-band high-frequency signal which is higher in frequency than said lower-band high-frequency signal.

2. A high-frequency amplifier according to claim 1, wherein the inductance of said second inductor in said input matching circuit is such that said second inductor is open for said higher-band high-frequency signal when said second inductor is viewed from the connection point of said input matching capacitor and said first inductor in said input matching circuit, the capacitance of said input matching capacitor in said input matching circuit is such that matching is achieved for said lower-band high-frequency signal, and the inductance of said first inductor in said input matching circuit is such that matching is achieved for said higher-band high-frequency signal.

3. A high-frequency amplifier for matching both a lower-band high-frequency signal and a higher-band high-frequency signal comprising:

an amplifying circuit having an input and an output;

an input circuit and an output circuit;

an input matching circuit connected between the input of said amplifying circuit and the input circuit; and an output matching circuit connected between the output of said amplifying circuit and the output circuit, wherein said output circuit includes an output terminal, an output coupling capacitor connected in series between said output terminal and said output matching circuit, wherein said output matching circuit includes a first inductor connected to the output of said amplifying circuit, an output matching capacitor connected between said first inductor and said output circuit, said output matching capacitor being separate from said output coupling capacitor, and a second inductor connected to the connection point of said first inductor and said output matching capacitor, said output matching capacitor and said second inductor form a lower-band frequency matching circuit for achieving matching for a lower-band high-frequency signal, and said first inductor forms a higher-band frequency matching circuit for achieving matching for a higher-band high-frequency signal which is higher in frequency than said lower-band high-frequency signal.

4. A high-frequency amplifier according to claim 3, wherein the inductance of said second inductor in said output matching circuit is such that said second inductor is open for said higher-band high-frequency signal when said second inductor is viewed from the connection point of said output matching capacitor and said first inductor in said output matching circuit, the capacitance of said output matching capacitor in said output matching circuit is such that matching is achieved for said lower-band high-frequency signal, and the inductance of said first inductor in said output matching circuit is such that matching is achieved for said higher-band high-frequency signal.

5. A high-frequency amplifier according to any one of claims 1, 2, 3, and 4, wherein said amplifying circuit includes:

an input transistor having a control terminal and first and second main terminals, of which the control terminal is connected to the output of said input matching circuit and the first terminal is connected to ground, an output transistor having a control terminal and first and second main terminals, of which the first terminal is connected to the second terminal of said input transistor and the second terminal is connected to the input of the output matching circuit, and a voltage source connected to the control terminal of said output transistor for applying a voltage to the control terminal of said output transistor, wherein said voltage source changes a voltage applied to the control terminal of said output transistor according to the frequency of a high-frequency signal amplified by said amplifying circuit for matching both said lower-band high-frequency signal and said higher-band high-frequency signal.

6. A high-frequency amplifier according to claim 5, wherein said voltage source in said amplifying circuit applies a predetermined voltage to the control terminal of said output transistor such that a minimum input reflection coefficient and a minimum output reflection coefficient are obtained for said higher-band high-frequency signal when said higher-band high-frequency signal is amplified, and applies a predetermined voltage to the control terminal of said output transistor such that a minimum input reflection coefficient and a minimum output reflection coefficient are obtained for said lower-band high-frequency signal when said lower-band high-frequency signal is amplified.

7. A high-frequency amplifier according to claim 5, wherein an impedance circuit is provided between said input transistor and said output transistor in said amplifying circuit.

8. A high-frequency amplifier according to claim 7, wherein said impedance circuit is formed of an inductor.

9. A high-frequency amplifier according to claim 8, wherein said input transistor and said output transistor in said amplifying circuit are field effect transistors.

10. A high-frequency amplifier according to claim 6, wherein an impedance circuit is provided between said input transistor and said output transistor in said amplifying circuit.

11. A high-frequency amplifier according to claim 10, wherein said impedance circuit is formed of an inductor.

12. A high-frequency amplifier according to claim 11, wherein said input transistor and said output transistor in said amplifying circuit are field effect transistors.

13. A high-frequency amplifier according to claim 7, wherein said input transistor and said output transistor in said amplifying circuit are field effect transistors.

14. A high-frequency amplifier according to claim 6, wherein said input transistor and said output transistor in said amplifying circuit are field effect transistors.

15. A high-frequency amplifier according to claim 5, wherein said input transistor and said output transistor in said amplifying circuit are field effect transistors.

* * * * *